(12) United States Patent
Hidaka

(10) Patent No.: US 7,272,036 B2
(45) Date of Patent: Sep. 18, 2007

(54) THIN FILM MAGNETIC MEMORY DEVICE SUITABLE FOR DRIVE BY BATTERY

(75) Inventor: Hideto Hidaka, Hyogo (JP)

(73) Assignee: Renesas Technology Corp., Chiyoda-ku, Tokyo (JP)

( * ) Notice: Subject to any disclaimer, the term of this patent is extended or adjusted under 35 U.S.C. 154(b) by 163 days.

(21) Appl. No.: 11/099,669

(22) Filed: Apr. 6, 2005

(65) Prior Publication Data

US 2005/0219894 A1    Oct. 6, 2005

(30) Foreign Application Priority Data

Apr. 6, 2004   (JP) .............................. 2004-112079

(51) Int. Cl.
*G11C 11/14* (2006.01)
(52) U.S. Cl. ...................... 365/161; 365/158; 365/171; 365/173
(58) Field of Classification Search ................ 365/158, 365/171, 161, 173
See application file for complete search history.

(56) References Cited

U.S. PATENT DOCUMENTS

| 6,034,887 | A | 3/2000 | Gupta et al. |
| 6,999,341 | B2 * | 2/2006 | Ooishi .................... 365/171 |
| 2005/0007834 | A1 | 1/2005 | Hidaka |

OTHER PUBLICATIONS

Scheuerlein et al., "A 10ns Read and Write Non-Volatile Memory Array Using a Magnetic Tunnel Junction and FET Switch in Each Cell", Feb. 2000, TA7.2, IEEE ISSCC Digest of Technical Papers.
Durlam et al., "Nonvolatile RAM based on Magnetic Tunnel Junction Elements", Feb. 2000, TA7.6, IEEE ISSCC Digest of Technical Papers.
Naji et al., "A 256kb 3.0V 1T1MTJ Nonvolatile Magnetoresistive RAM", Feb. 2001, TA7.6, IEEE ISSCC Digest of Technical Papers.
Durlam et al., "A 1-Mbit MRAM Based on 1T1MTJ Bit Cell Integrated With Copper Interconnects", IEEE Journal of Solid-State Circuits, May 2003, pp. 769-773, vol. 38, No. 5.

* cited by examiner

*Primary Examiner*—Anh Phung
*Assistant Examiner*—Pho M. Luu
(74) *Attorney, Agent, or Firm*—Buchanan Ingersoll & Rooney PC

(57) ABSTRACT

After a digit line is charged to a power supply voltage by turn-on of a first switching element, the first switching element is turned off and a second switching element is turned on, whereby the digit line is connected to a ground voltage. Similarly, in order to feed data write current, a bit line is charged to a data voltage in accordance with write data through a third switching element. Then, the bit line is connected to a voltage different from the data voltage by a fourth switching element while the third switching element is turned off. Therefore, a load current from a power supply to an MRAM device is supplied during charging of a digit line capacitance and a bit line capacitance, without being consumed when the data write current flows. Consequently, a peak of the load current supplied from the power supply is suppressed.

18 Claims, 33 Drawing Sheets

FIG.6

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0/1 | | | | | Stby |
| Din(75) | – | – | – | "L"/"H" | – | "L"/"H" | – | – | – |
| S1 | OFF | OFF | OFF | OFF | ON | OFF | OFF | ON | OFF |
| S2 | ON | (ON) | ON | OFF | OFF | OFF | ON | OFF | ON |
| S3 | OFF | (ON) | OFF | ON | OFF | ON | OFF | OFF | OFF |
| S4a | OFF | OFF | OFF | OFF | ON | OFF | OFF | OFF | OFF |
| S4b | ON | OFF | ON | OFF | OFF | OFF | OFF | ON | ON |

↑ Ip,Iw(0) (cycle 5)
↑ Ip, Iw(1) (cycle 8)

→ TIME

R0·C : SMALL

DURING CHARGING

DURING DISCHARGING

FIG.13

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0 | | Stby | Write 1 | | Stby |
| Din(75) | – | – | – | "L" | Z | – | "H" | Z | – |
| S1 | OFF | OFF | OFF | OFF | ON | OFF | OFF | ON | OFF |
| S2 | ON | (ON) | ON | OFF | OFF | ON | OFF | OFF | ON |
| S3 | OFF | (ON) | OFF | ON | OFF | OFF | ON | OFF | OFF |
| S4a | OFF | | OFF | OFF | ON | OFF | OFF | OFF | OFF |
| S4b | ON | OFF | ON | OFF | OFF | ON | OFF | ON | ON |
| | | | | Ip,Iw(0) or Iw(1) | | | Ip,Iw(0) or Iw(1) | | |

→ TIME

| CLOCK CYCLE | 1 | 2 | 3 | 4 | 5 | 6 | 7 | 8 |
|---|---|---|---|---|---|---|---|---|
| OPERATION | Stby | Read | Stby | Write 0/1 | | | | Stby |
| Din(75) | – | – | – | "L"/"H" | – | "L"/"H" | – | – |
| S1 | OFF | OFF | OFF | OFF | ON | OFF | OFF | OFF |
| S1# | OFF | OFF | OFF | OFF | OFF | OFF | ON | OFF |
| S2 | ON | (ON) | ON | OFF | OFF | OFF | OFF | ON |
| S3 | OFF | (ON) | OFF | ON | OFF | ON | OFF | OFF |
| S4a | OFF | OFF | OFF | OFF | ON | OFF | OFF | OFF |
| S4b | ON | OFF | ON | OFF | OFF | OFF | ON | ON |
| | | | | | Ip,Iw(0) | | −Ip, Iw(1) | |

→ TIME

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0/1 | | | | | Stby |
| Din(75) | – | – | – | "L"/"H" | – | "L"/"H" | – | – | – |
| φ(DL) | Vcc | Vcc | Vcc | Vcc | Z | Z | Vcc | Z | Vcc |
| S1 | OFF | OFF | OFF | OFF | ON | OFF | OFF | ON | OFF |
| S2 | ON | (ON) | ON | ON | ON | OFF | ON | ON | ON |
| S3 | OFF | OFF | OFF | ON | ON | ON | ON | ON | OFF |
| S3# | OFF | ON | OFF | OFF | OFF | OFF | OFF | OFF | OFF |
| S4a | OFF | OFF | OFF | OFF | ON | OFF | OFF | OFF | OFF |
| S4b | ON | OFF | ON | OFF | OFF | OFF | OFF | ON | ON |
| | | | | | Ip,Iw(0) | | | Ip, Iw(1) | |

→ TIME

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0 | | Stby | Write 1 | | Stby |
| Din(75) | – | – | – | "L" | Z | – | "H" | Z | – |
| φ(DL) | Vcc | Vcc | Vcc | Vcc | Z | Vcc | Vcc | Z | Vcc |
| S1 | OFF | OFF | OFF | OFF | ON | OFF | OFF | ON | OFF |
| S2 | ON | (ON) | ON | ON | ON | ON | ON | ON | ON |
| S3 | OFF | OFF | OFF | ON | ON | OFF | ON | ON | OFF |
| S3# | OFF | ON | OFF | OFF | OFF | OFF | OFF | OFF | OFF |
| S4a | OFF | OFF | OFF | OFF | ON | OFF | OFF | OFF | OFF |
| S4b | ON | OFF | ON | OFF | OFF | ON | OFF | ON | ON |
| | | | | Ip,Iw(0) or Iw(1) | | | Ip,Iw(0) or Iw(1) | | |

→ TIME

FIG.21

| CLOCK CYCLE | 1 | 2 | 3 | 4 | 5 | 6 | 7 | 8 |
|---|---|---|---|---|---|---|---|---|
| OPERATION | Stby | Read | Stby | Write 0/1 | | | | Stby |
| Din(75) | − | − | − | "L"/"H" | − | "L"/"H" | − | − |
| φ(DL) | Vcc | Vcc | Vcc | Vcc | Z | Z | Z | Vcc |
| S1 | OFF | OFF | OFF | OFF | ON | OFF | OFF | OFF |
| S1# | OFF | OFF | OFF | OFF | OFF | OFF | ON | OFF |
| S2 | ON | (ON) | ON | ON | ON | ON | ON | ON |
| S3 | OFF | OFF | OFF | ON | ON | ON | ON | OFF |
| S3# | OFF | ON | OFF | OFF | OFF | OFF | OFF | OFF |
| S4a | OFF | OFF | OFF | OFF | ON | OFF | OFF | OFF |
| S4b | ON | OFF | ON | OFF | OFF | OFF | ON | ON |

Ip,Iw(0)    Ip,Iw(1)  → TIME

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0/1 | | | | | Stby |
| Din(75) | – | – | – | "L"/"H" | – | "L"/"H" | – | – | – |
| φ(DL) | Vcc | Vcc | Vcc | Vcc | Z | Z | Vcc | Z | Vcc |
| S1 | OFF | OFF | OFF | OFF | ON | OFF | OFF | ON | OFF |
| S3 | OFF | OFF | OFF | ON | ON | ON | ON | ON | OFF |
| S4a | OFF | OFF | OFF | OFF | ON | OFF | OFF | OFF | OFF |
| S4b | ON | OFF | ON | OFF | OFF | OFF | OFF | ON | ON |

Ip,Iw(0)    Ip,Iw(1) → TIME

| CLOCK CYCLE | 1 | 2 | 3 | 4 | 5 | 6 |
|---|---|---|---|---|---|---|
| OPERATION | Stby | Read | Stby | Write | | Stby |
| Din(75) | – | – | – | "L" | Z | – |
| /Din(75#) | – | – | – | "H" | Z | – |
| φ(DL) | Vcc | Vcc | Vcc | Vcc | Z | Vcc |
| S1 | OFF | OFF | OFF | OFF | ON | OFF |
| S3 | OFF | OFF | OFF | OFF | ON | OFF |
| S4 | OFF | OFF | OFF | OFF | ON | OFF |
| | | | | | Iw(0) Ip, Iw(1) | → TIME |

|  | Din | S1 | S3 | S4a | S4b | Sa | Sb |
|---|---|---|---|---|---|---|---|
| Write 0 | "L" | ON | ON | ON | OFF | OFF | ON |
| Write 1 | "H" | ON | ON | OFF | ON | ON | OFF |

|  | Din | S1 | S4a | S4b | S3a | S3b |
|---|---|---|---|---|---|---|
| Write 0 | "L" | ON | ON | OFF | OFF | ON |
| Write 1 | "H" | ON | OFF | ON | ON | OFF |
| NON-SELECTED | – | OFF | OFF | OFF | OFF | OFF |

FIG.37

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0/1 | | | | | Stby |
| Din(75) | – | – | – | "L"/"H" | "L"/"H" | – | "L"/"H" | "L"/"H" | – |
| S2 (SELECTED ROW) | ON | (ON) | ON | ON | ON | OFF | ON | ON | ON |
| S2 (NON-SELECTED ROW) | ON | (ON) | ON | OFF | OFF | OFF | OFF | OFF | ON |
| S1 | OFF | OFF | OFF | OFF | ON | OFF | OFF | ON | OFF |
| S3 | OFF | OFF | OFF | ON | ON | ON | ON | ON | OFF |
| S4a | OFF | OFF | OFF | OFF | ON | OFF | OFF | OFF | OFF |
| S4b | ON | OFF | ON | OFF | OFF | OFF | OFF | ON | ON |
| Sa | OFF | OFF | OFF | OFF | OFF | OFF | OFF | OFF | OFF |
| Sb | OFF | OFF | OFF | OFF | ON | OFF | OFF | ON | OFF |

→ TIME

FIG.39

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write 0 | | Stby | Write 1 | | Stby |
| Din(WDB) | – | – | – | "L" | "L" | – | "H" | "H" | – |
| /Din(/WDB) | – | – | – | "H" | "H" | – | "L" | "L" | – |
| S2 (SELECTED ROW) | ON | (ON) | ON | ON | ON | ON | ON | ON | ON |
| S2 (NON-SELECTED ROW) | ON | (ON) | ON | OFF | OFF | ON | OFF | OFF | ON |
| S1 | OFF | OFF | OFF | OFF | ON | OFF | OFF | ON | OFF |
| S3 | OFF | OFF | OFF | OFF | ON | OFF | OFF | ON | OFF |
| S4 | OFF | OFF | OFF | OFF | ON | OFF | OFF | ON | OFF |
| Sa,Sc | OFF | OFF | OFF | OFF | OFF | OFF | OFF | ON | OFF |
| Sb,Sd | OFF | OFF | OFF | OFF | ON | OFF | OFF | OFF | OFF |

TIME →

FIG.41

| CLOCK CYCLE | 1 | 2 | 3 | 4 | 5 | 6 | 7 | 8 | 9 |
|---|---|---|---|---|---|---|---|---|---|
| OPERATION | Stby | Read | Stby | Write | | | | | Stby |
| Din(75) | − | − | − | "L" | − | "H" | − | − | − |
| S1 | OFF | OFF | OFF | OFF | ON | OFF | OFF | ON | OFF |
| S2 | ON | (ON) | ON | OFF | OFF | OFF | ON | OFF | ON |
| S3 | OFF | (ON) | OFF | ON | OFF | ON | OFF | OFF | OFF |
| S4a(j) | OFF | OFF | OFF | OFF | ON | OFF | OFF | OFF | OFF |
| S4b(j) | ON | OFF | ON | OFF | OFF | OFF | OFF | ON | ON |
| S4a(k) | OFF | OFF | OFF | OFF | ON | OFF | OFF | OFF | OFF |
| S4b(k) | ON | OFF | ON | OFF | OFF | OFF | OFF | ON | ON |

Ip, Iw(0) at cycle 5; Ip, Iw(1) at cycle 8

→ TIME

THIN FILM MAGNETIC MEMORY DEVICE SUITABLE FOR DRIVE BY BATTERY

BACKGROUND OF THE INVENTION

1. Field of the Invention

The present invention relates to a thin film magnetic memory device, and more particularly, to a thin film magnetic memory device suitable for drive by a battery.

2. Description of the Background Art

Recently, a magnetic random access memory device (MRAM device) has attracted attention as a high-speed and highly integrated non-volatile memory. The MRAM device represents a memory device using a plurality of thin film magnetic elements formed on a semiconductor integrated circuit as a memory cell permitting random access thereto.

Particularly, it has been disclosed that a performance of the MRAM device is enhanced by employing a memory cell constituted of thin film magnetic elements utilizing magnetic tunnel junction (MTJ) (hereinafter, also referred to as an "MTJ memory cell"). The MTJ memory cell stores data, by being magnetized in a direction in accordance with write data by a magnetic field produced by a data write current. Data reading from the MTJ memory cell is carried out by utilizing such a characteristic of the MTJ memory cell that an electric resistance of the MTJ memory cell is varied in accordance with the magnetic direction. Since the magnetic direction of the MTJ memory cell that has once stored data is held until another magnetic field is applied and the data is rewritten, the MRAM device is capable of non-volatile data storage (for example, see U.S. Pat. No. 6,034,887; "A 10 ns Read and Write Non-Volatile Memory Array Using a Magnetic Tunnel Junction and FET Switch in each Cell," by Roy Scheuerlein et al., 2000 IEEE ISSCC Digest of Technical Papers, TA7.2, "Nonvolatile RAM based on Magnetic Tunnel Junction Elements," by M. Durlam et al., 2000 IEEE ISSCC Digest of Technical Papers, TA7.3; and "A 256 kb 3.0V 1T1MTJ Nonvolatile Magnetoresistive RAM," by Peter K. Naji et al., 2001 IEEE ISSCC Digest of Technical Papers, TA7.6).

In addition, a technology for achieving higher integration by covering a metal wire through which a data write current flows with a thin ferromagnetic material in an MRAM device has also been reported (for example, see "A 1-Mbit MRAM Based on 1T1MTJ Bit Cell Integrated With Copper Interconnects," by Mark Durlam et al., IEEE JOURNAL OF SOLID-STATE CIRCUITS, VOL. 38, NO. 5, MAY 2003, pp. 769-773).

As the MRAM device is excellent in terms of a degree of integration and the number of permitted times of rewriting, portable application of the same such as portable electronics including a portable phone and an IC card has been expected. With regard to portable use, as it is difficult to constantly supply electric power from an outside source, limited electric power supply from a battery or the like is performed.

As disclosed in the documents listed above, however, in the MRAM device, a pulse-like current (data write current) is consumed in order to produce a magnetic field for data write. Therefore, a load current to the MRAM device supplied from a power supply represents a high-frequency, pulse-like current. In general, such a load current pattern accelerates battery exhaustion. Therefore, if the MRAM device is applied to portable use, a period for electric power supply from the battery may be shortened.

In addition, it is difficult to ensure electric power capacity of the power supply in an application such as an IC card or the like. Therefore, it is necessary to ensure a sufficient data write current level within the MRAM device serving as a load under such a condition that a peak value of the load current supplied by the power supply is restricted. Moreover, in a portable application, a smaller circuit area of the MRAM device is desirable.

SUMMARY OF THE INVENTION

The present invention was made to solve the above-described problems. An object of the present invention is to provide a thin film magnetic memory device suitable for a portable application, attaining a suppressed peak of a load current supplied from a power supply (battery).

Another object of the present invention is to provide a thin film magnetic memory device capable of ensuring a magnitude of a data write current without increasing a circuit area.

A thin film magnetic memory device according to the present invention includes: a plurality of first write current lines for selectively feeding a first data write current; a plurality of magnetic memory cells into which data is written by application of magnetic field produced by the first data write current; and a first switching element provided corresponding to one end of each of the first write current lines. The first switching element is arranged to allow the first data write current to flow by connecting corresponding one of the first current write lines charged to a first voltage to a second voltage different from the first voltage.

Preferably, the thin film magnetic memory device further includes a second switching element provided corresponding to the other end of each of the first write current lines. The second switching element is conducted during at least a part of a non-conducted period of the first switching element, so as to electrically connect the corresponding first write current line to the first voltage, and is rendered non-conducting during a conducted period of the first switching element, so as to electrically disconnect the corresponding first write current line from the first voltage.

A thin film magnetic memory device according to another configuration of the present invention includes: a plurality of write current lines for feeding a data write current flowing in a direction in accordance with write data; a plurality of magnetic memory cells into which data is written by application of data write magnetic field produced by the data write current; a data bus set to one of a plurality of data voltages in accordance with a level of the write data; a first write switching element provided corresponding to one end of each of the write current lines and for electrically connecting the one end to the data bus; and a plurality of second write switching elements for electrically connecting the other ends of the write current lines to the plurality of data voltages respectively. One of the plurality of second write switching elements corresponding to a data voltage different from a voltage of the data bus is conducted in order to allow the second data write current to flow.

A thin film magnetic memory device according to yet another configuration of the present invention includes: a plurality of write current lines for feeding a data write current flowing in a direction in accordance with write data; a plurality of magnetic memory cells into which data is written by application of data write magnetic field produced by the data write current; a first write driver shared by at least two of the plurality of write current lines; and a second write driver arranged corresponding to each of the plurality of write current lines. The first write driver connects one end side of the at least two of write current lines to one of a plurality of data voltages in accordance with a level of the write data when the at least two write current lines sharing the first write driver include a data write target. The second write driver connects the other end side of corresponding write current line to another one of the plurality of data voltages when the corresponding write current line is the data write target, while it disconnects the other end side of the corresponding write current line from any other one of the plurality of data voltages when the corresponding write current line is not the data write target.

Therefore, in the thin film magnetic memory device according to the present invention, charges stored in the first write current line prior to a first data write current supply period are used to feed the first data write current. Accordingly, concentration of the load current supplied from the power supply such as a battery to the thin film magnetic memory device during the data write current period and a resultant short-period, large-current waveform causing considerable battery exhaustion is avoided, and the load current supplied from the power supply can exhibit an improved, gentle waveform. Consequently, the period for electric power supply from the power supply (battery) can be extended, and a time period for which equipment incorporating the thin film magnetic memory device (MRAM device) can be driven can be extended.

In particular, the second switching element is provided so that charging of the first write current line and supply of the first data write current can be carried out in different periods. Therefore, the load current supplied from the power supply can exhibit a further improved, gentle waveform.

In addition, one side of the write current line is connected to the write node set to a voltage in accordance with the write data, while the other side thereof is connected to a voltage different from the voltage set at the write node by means of a plurality of write switching elements that are selectively turned on. In this manner, a data write current in a direction in accordance with the write data can flow on the write current line. Therefore, as compared with a configuration in which a plurality of write switches are provided on each side of the write current line, the number of switching elements to be arranged can be reduced. Moreover, as compared with a configuration in which complementary data buses are arranged on opposing sides of the write current line respectively, a path for the data write current can be shortened and a parasitic resistance on that path can be suppressed. In the thin film magnetic memory device, reduction in the circuit area and facilitated manner of ensuring the magnitude of the data write current can thus be realized in a balanced manner.

Alternatively, a plurality of write current lines may share a write driver on one end side of the write current line, and a write driver on the other end side may be arranged for each current write line. With such a configuration as well, a data write current in a direction in accordance with the write data can flow on the write current line. Therefore, while avoiding an extended length of a path for the data write current, the number of write drivers to be arranged can be reduced. In this manner, reduction in the circuit area and facilitated manner of ensuring the magnitude of the data write current can both be realized in the thin film magnetic memory device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 illustrates an operation of the MRAM device according to the first embodiment.

FIG. 13 illustrates an operation of the MRAM device according to a first variation of the first embodiment.

FIG. 21 illustrates an operation of the MRAM device according to the second variation of the second embodiment.

FIG. 37 illustrates an operation of the MRAM device according to the fifth embodiment.

FIG. 39 illustrates an operation of the MRAM device shown in FIG. 35.

FIG. 41 illustrates an operation of the MRAM device shown in FIG. 40.

DESCRIPTION OF THE PREFERRED EMBODIMENTS

Figure 1:
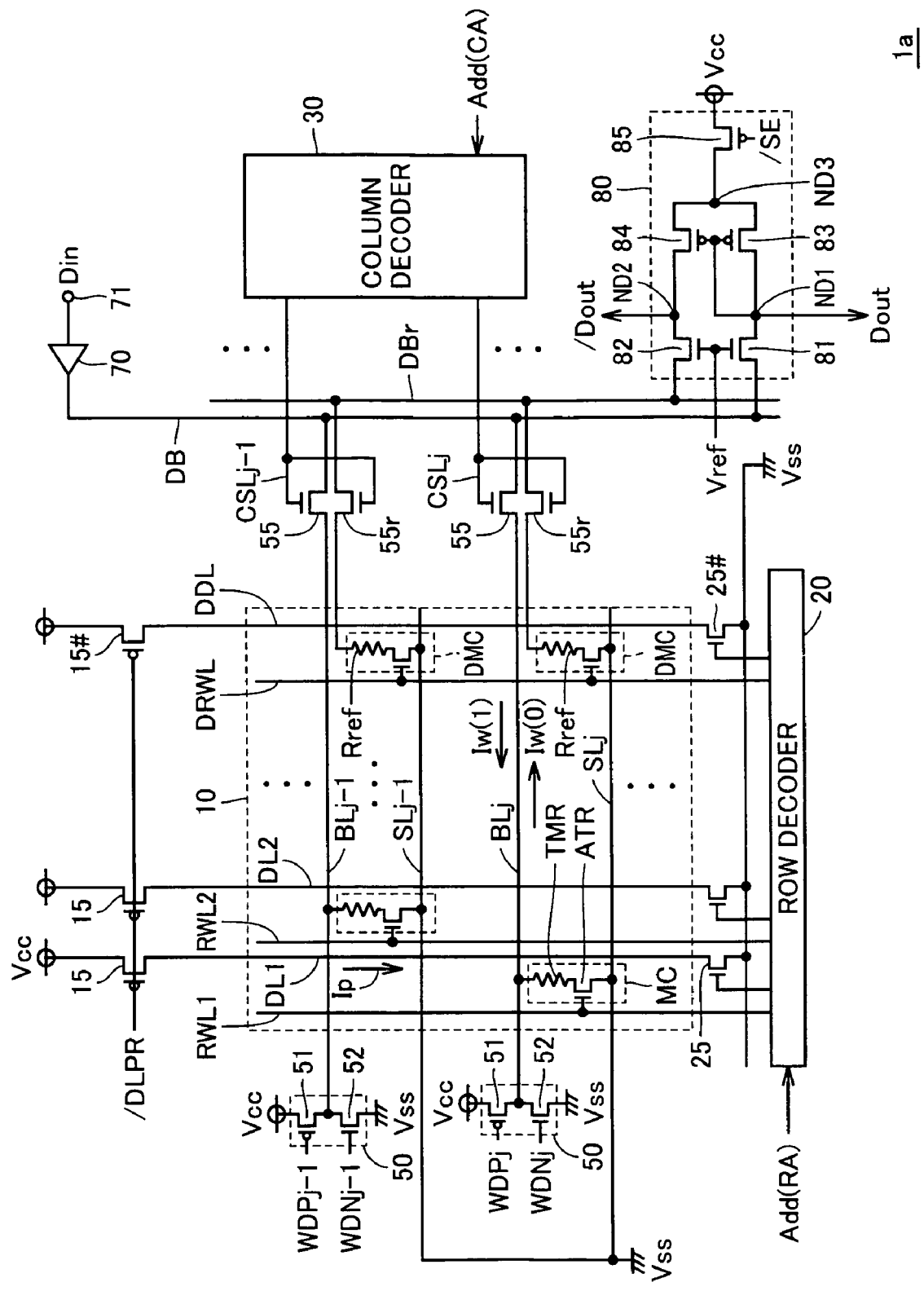
FIG. 1 is a schematic block diagram showing an overall configuration of an MRAM device according to a first embodiment of the present invention.

Embodiments of the present invention will be described hereinafter in detail with reference to the drawings. The same or corresponding elements have the same reference characters allotted, and in principle, detailed description thereof will not be repeated.

First Embodiment

FIG. 1 is a schematic block diagram showing an overall configuration of an MRAM device 1a according to a first embodiment of the present invention.

Referring to FIG. 1, the MRAM device carries out random access in response to an external control signal (not shown) and an address signal Add, and receives input of write data Din and supplies output of read data Dout. An internal operation of an MRAM device 1 represented by a data read operation and a data write operation is carried out by a not-shown control circuit in response to the control signal. The internal operation is performed, for example, at a timing in synchronization with an external clock signal (not shown). Alternatively, an operation timing may be determined within the MRAM without receiving an external clock signal.

MRAM device 1a includes a memory cell array 10, a row decoder 20, a column decoder 30, a write buffer 70, a data read amplifier 80, and a data bus DB and a reference data bus DBr.

In memory cell array 10, a plurality of MTJ memory cells MC arranged in matrix (hereinafter, also simply referred to as "memory cell") and a plurality of dummy memory cells DMC serving as reference in data read and arranged so as to form a dummy row are provided.

A read word line RWL for data read and a digit line DL for data write are arranged, corresponding to a row of memory cells (memory cell row). On the other hand, a dummy read word line DRWL for data read is arranged, corresponding to a row of dummy memory cells (dummy cell row). Memory cell MC and dummy memory cell DMC are arranged so as to share a memory cell column, and a bit line BL is arranged corresponding to each memory cell column.

Each memory cell MC and each dummy memory cell DMC are connected to a prescribed voltage Vss through a source line SL. As a ground voltage is normally used as prescribed voltage Vss, prescribed voltage Vss is also referred to as ground voltage Vss hereinafter.

Each memory cell MC has an access transistor ATR and a tunneling magneto-resistance element TMR connected in series between corresponding bit line BL and source line SL.

Here, a configuration and a principle in data storage of an MTJ memory cell will be described.

Figure 2:
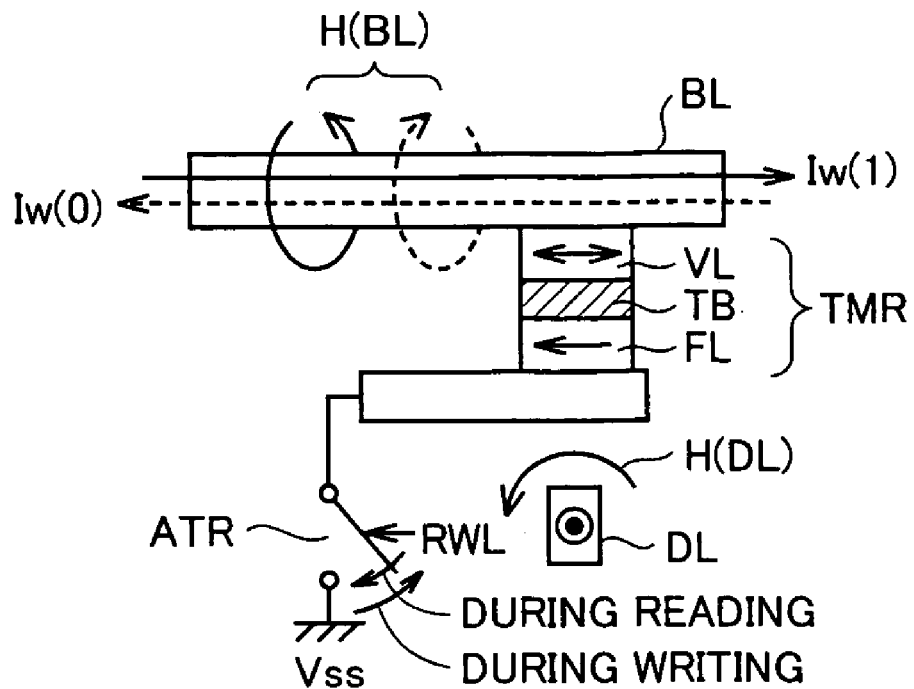
FIG. 2 is a conceptual view illustrating a configuration and a principle in data storage of an MTJ memory cell.

FIG. 2 is a conceptual view illustrating a configuration and a principle in data storage of an MTJ memory cell.

Referring to FIG. 2, tunneling magneto-resistance element TMR includes a ferromagnetic material layer FL having a constant, fixed magnetic direction (hereinafter, simply referred to as a "fixed magnetic layer (FL)", and a ferromagnetic material layer VL that can be magnetized in a direction in accordance with an externally applied magnetic field (hereinafter, simply referred to as a "free magnetic layer (VL)". A tunneling barrier (a tunneling film) TB formed with an insulating film is provided between fixed magnetic layer FL and free magnetic layer VL. Free magnetic layer VL is magnetized in a direction identical or opposite to fixed magnetic layer FL, in accordance with the write data. These fixed magnetic layer FL, tunneling barrier TB, and free magnetic layer VL form the magnetic tunnel junction (MTJ).

An electric resistance of tunneling magneto-resistance element TMR varies in accordance with a relative relation in respective magnetic directions of fixed magnetic layer FL and free magnetic layer VL. Specifically, the electric resistance of tunneling magneto-resistance element TMR is set to a minimum value Rmin when the fixed magnetic layer FL is magnetized in a direction identical to (in parallel to) that of free magnetic layer VL, while it is set to a maximum value Rmax when one of the above layers is magnetized in a direction opposite (antiparallel) to the other.

In data write, read word line RWL is inactivated, and access transistor ATR is turned off. In such a state, data write magnetic fields H(BL) and H(DL) for magnetizing free magnetic layer VL are produced by data write currents flowing through bit line BL and digit line DL respectively. In particular, as the data write current on bit line BL is set to one of Iw(0) and Iw(1), that are opposite to each other in direction, in accordance with the level of the write data, the direction of data write magnetic field H(BL) applied to free magnetic layer VL is different depending on the level of the write data.

Figure 3:
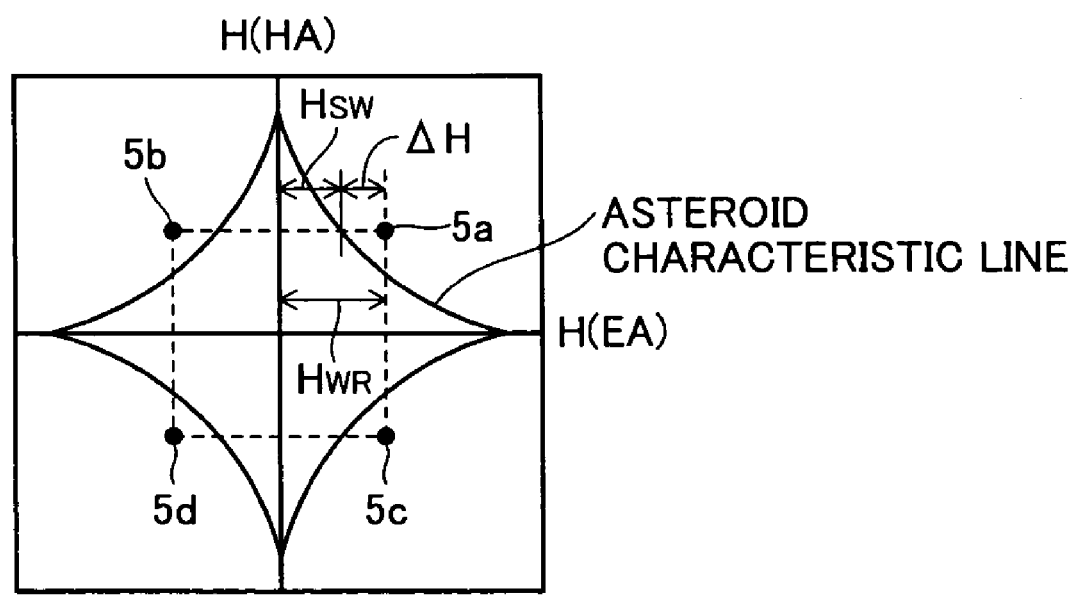
FIG. 3 is a conceptual view showing a relation between a data write current in the MTJ memory cell and a magnetic direction of a tunneling magneto-resistance element.

FIG. 3 is a conceptual view showing a relation between a data write current in the MTJ memory cell and a magnetic direction of a tunneling magneto-resistance element.

Referring to FIG. 3, the abscissa H(EA) represents a magnetic field applied in a direction of an easy axis (EA) in free magnetic layer VL within tunneling magneto-resistance element TMR. On the other hand, the ordinate H(HA) represents a magnetic field acting in a direction of a hard axis (HA) in free magnetic layer VL. Magnetic fields H(EA) and H(HA) correspond to data write magnetic fields H(BL) and H(DL) shown in FIG. 2, respectively.

In the MTJ memory cell, the fixed magnetic direction of fixed magnetic layer FL extends along the easy axis of free magnetic layer VL, while free magnetic layer VL is magnetized along the easy axis in a direction parallel or anti-parallel (opposite) to fixed magnetic layer FL, in accordance with the level of the write data. The MTJ memory cell can store 1-bit data, associated with two magnetic directions of free magnetic layer VL.

The magnetic direction of free magnetic layer VL can be rewritten only when the sum of applied magnetic fields H(EA) and H(HA) reaches a region outside an asteroid characteristic line. In other words, if the applied data write magnetic field has intensity within a region inside the asteroid characteristic line, the magnetic direction of free magnetic layer VL does not change.

As shown with the asteroid characteristic line, a magnetization threshold value necessary for varying the magnetic direction along the easy axis can be lowered by applying a magnetic field in the direction of hard axis to free magnetic layer VL. As shown in FIG. 3, an operation point in data write is designed such that, when a prescribed data write current is fed to both of digit line DL and bit line BL, data stored in the MTJ memory cell, that is, the magnetic direction of tunneling magneto-resistance element TMR, is rewritten.

Operation points 5*a* to 5*d* illustrated in FIG. 3 are designed such that data write magnetic field H(EA) in the direction of easy axis has intensity of $H_{WR}$ in the MTJ memory cell which is a data write target. In other words, a value of the data write current fed to bit line BL or digit line DL is designed so as to obtain data write magnetic field $H_{WR}$. Generally, data write magnetic field H is shown as the sum of a switching magnetic field $H_{SW}$ necessary for switching the magnetic direction and a margin $\Delta H$. That is, it is shown as $H_{WR}=H_{SW}+\Delta H$.

The direction of data write magnetic field H(HA) in the direction of hard axis does not affect the data written in MTJ memory cell. In other words, data of an identical value can be written in the MTJ memory cell using any of operation points 5*a* and 5*c*. Similarly, data of an identical value can be written in the MTJ memory cell using any of operation points 5*b* and 5*d*.

The magnetic direction once written in tunneling magneto-resistance element TMR, that is, the data stored in the MTJ memory cell, is held in a non-volatile manner until new data write is performed. Strictly speaking, an electric resistance of each memory cell is the sum of resistance of tunneling magneto-resistance element TMR and on-resistance of access transistor ATR and other parasitic resistance. Here, as the resistance other than the resistance of tunneling magneto-resistance element TMR is constant regardless of the storage data, two types of resistance in accordance with the data stored in the MTJ memory cell are also hereinafter denoted as Rmax and Rmin, and a difference therebetween is denoted as $\Delta R$ (that is, $\Delta R=Rmax-Rmin$).

During data read, a current passing through tunneling magneto-resistance element TMR produced by turn-on of access transistor ATR is sensed through bit line BL, so that a resistance level of a selected memory cell, that is, the storage data, can be read out.

Referring again to FIG. 1, dummy memory cell DMC is configured to attain a resistance Rref intermediate between two types of resistance Rmax and Rmin of memory cell MC described above (for example, $Rref=Rmin+\Delta R/2$). Each dummy memory cell DMC is configured such that intermediate resistance Rref is electrically connected between reference data bus DBr and source line SL (ground voltage Vss) in response to activation of dummy read word line DRWL.

Since the configuration of dummy memory cell DMC is not particularly limited, a configuration obviating the need for magnetic data write into dummy memory cell DMC after fabrication by fixing resistance Rref at the time of fabrication may be adopted. In such a configuration, arrangement of a dummy digit line DDL for data write is not necessary. In order to prevent poor dimension accuracy due to discontinuous shape at an end portion of memory cell array 10 during fabrication, however, dummy digit line DDL may be provided, even though it is not used.

One end of each digit line DL is connected to ground voltage Vss, for example, through a transistor switch 25 implemented by an nMOS transistor. Meanwhile, the other end of each digit line DL is connected to power supply voltage Vcc, for example, through a transistor switch 15 implemented by a pMOS transistor. Each transistor switch 15 is turned on in response to activation of a digit line precharge signal /DLPR. Meanwhile, each transistor switch 25 is turned on in a selected row during data write, based on a result of decoding of a row address signal Add(RA) by row decoder 20.

Dummy digit line DDL can be connected to power supply voltage Vcc and ground voltage Vss through transistor switches 15# and 25# provided in a manner similar to transistor switches 15 and 25. As described above, in order to ensure a continuous shape, transistor switches 15# and 25# may be provided as dummies in the configuration not requiring magnetic data write into dummy memory cell DMC.

One end side of each bit line BL is connected to data bus DB through a column selection switch 55. Meanwhile, a write driver 50 is arranged on the other end side of each bit line BL. Each dummy memory cell DMC is connected to reference data bus DBr through a column selection switch 55r.

Column selection switches 55, 55r are provided corresponding to each memory cell column, and turned on/off in response to a corresponding column selection line CSL. Column decoder 30 controls activation of each column selection line CSL such that column selection switches 55, 55r are turned on in a selected column and turned off in a non-selected column based on a result of decoding of a column address signal Add(CA). For example, an nMOS transistor implements each of column selection switches 55, 55r.

FIG. 1 illustrates, as representatives, read word lines RWL1, RWL2, digit lines DL1, DL2, bit lines BLj−1, BLj, column selection lines CSLj−1, CSLJ, and source lines SLj−1, SLJ corresponding to first and second rows and jth and (−1)th columns (j: natural number).

In the present embodiment, reference characters RWL, DL, BL, CSL, and SL are used to collectively denote the read word line, the digit line, the bit line, the column selection line, and the source line, respectively. In addition, a high-voltage state (power supply voltage Vcc) and a low-voltage state (ground voltage Vss) of data, a signal, and a signal line are referred to as "H level" and "L level", respectively.

Write buffer 70 drives data bus DB to a data voltage in accordance with write data Din input to a data terminal 71. In the present embodiment, it is assumed that data bus DB is set to the power supply voltage (Vcc) when write data Din="H level", and data bus DB is set to the ground voltage (Vss) when write data Din="L level". In other words, during data write, both power supply voltage Vcc and ground voltage Vss correspond to the "data voltage".

Write driver 50 has transistor switches 51 and 52 electrically connected between power supply voltage Vcc, ground voltage Vss corresponding to the data voltage described above and corresponding bit line BL, respectively. For example, transistor switch 51 is implemented by a pMOS transistor, while transistor switch 52 is implemented by an NMOS transistor.

The gate of transistor switch 51 receives a control signal WDP, and the gate of transistor switch 52 receives a control signal WDN. Control signals WDP, WDN are generated independently for each memory cell column. FIG. 1 illustrates control signals WDPj−1, WDPj, WDNj−1, and WDNj corresponding to jth column and (j−1)th column.

Data read amplifier 80 has NMOS transistors 81, 82 and pMOS transistors 83, 84 constituting a current mirror amplifier as well as a pMOS transistor 85 for supplying the current mirror amplifier with an operation current.

NMOS transistor 81 is electrically connected between data bus DB and a node ND1, and NMOS transistor 82 is electrically connected between reference data bus DBr and a node ND2. PMOS transistors 83, 84 are electrically connected between nodes ND1, ND2 and a node ND3, respectively. PMOS transistor 85 is electrically connected between node ND3 and power supply voltage Vcc, and receives a sense enable signal /SE at the gate.

The gates of nMOS transistors 81 and 82 commonly receive a prescribed voltage Vref, and the gates of pMOS transistors 83 and 84 are commonly connected to node ND 1. Read data Dout is generated at node ND 1, and inverted data /Dout of read data Dout is output to node ND2.

An outline of the data write operation and a data read operation of MRAM device 1a shown in FIG. 1 will now be described.

During the data write operation, a data write current Ip in a prescribed direction regardless of write data Din flows on digit line DL in a selected row under on/off control of transistor switch 25 by row decoder 20, while data write current Ip does not flow on digit line DL in a non-selected row. It is data write current Ip that produces data write magnetic field H(HA) along the direction of hard axis shown in FIG. 3. That is, data write current Ip corresponds to a "first data write current" in the present invention, and each digit line DL corresponds to a "first write current line" in the present invention.

In addition, either data write current Iw(0) or data write current Iw(1) flows on bit line BL in a selected column in accordance with write data Din under on/off control of transistor switches 51, 52 constituting write driver 50 and column selection switch 55. The magnetic field produced by data write currents Iw(0) and Iw(1) corresponds to data write magnetic field H(EA) along the easy axis described in connection with FIG. 3. On the other hand, bit line BL in a non-selected column is basically set to a floating state. That is, transistor switches 51, 52 and column selection switch 55 are turned off.

As such, data write magnetic fields produced by data write current Ip and data write current Iw(0) or Iw(1) are applied to the selected memory cell, and a state shown with any of operation points 5a to 5d in FIG. 3 is attained. In this manner, tunneling magneto-resistance element TMR in the selected memory cell is magnetized in a direction in accordance with write data Din. That is, data write current Iw(0), IW(1) corresponds to a "second data write current" in the present invention, and each bit line BL corresponds to a "second write data current" in the present invention.

As will be described in detail later, in the MRAM device according to the present invention, data write is controlled such that current consumption in the MRAM device during data write, that is, a waveform of the load current supplied from power supply voltage Vcc (a battery is assumed as a representative example) does not exhibit a steep slope.

During data read, transistor switches 15, 25 are controlled so as not to feed a current to each digit line DL, and read word line RWL in the selected row and dummy read word line DRWL are activated. As such, access transistor ATR is turned on in the selected memory cell, and tunneling magneto-resistance element TMR is connected between bit line BL in the selected column and ground voltage Vss (source line SL). In addition, in response to turn-on of column selection switches 55, 55r in the selected column, any one of resistances Rmax and Rmin is connected between data bus DB and ground voltage Vss (source line SL) in accordance with the data stored in the selected memory cell, and intermediate resistance Rref of dummy memory cell DMC is connected between reference data bus DBr and ground voltage Vss (source line SL).

When pMOS transistor 85 is turned on in such a state in response to sense enable signal /SE activated to L level, an operation current is supplied to the current mirror amplifier constituted of nMOS transistors 81, 82 and pMOS transistors 83, 84. Accordingly, a current difference having a polarity in accordance with the data stored in the selected memory cell is produced between data bus DB connected to node ND 1 through nMOS transistor 81 and reference data bus DBr connected to node ND2 through nMOS transistor 82. The current difference is amplified to a voltage difference between nodes ND 1 and ND2 by the current mirror amplifier. In this manner, read data Dout in accordance with the data stored in the selected memory cell is generated at node ND 1.

Data write current supply in MRAM device 1*a* according to the present embodiment will now be described in detail.

Figure 4:
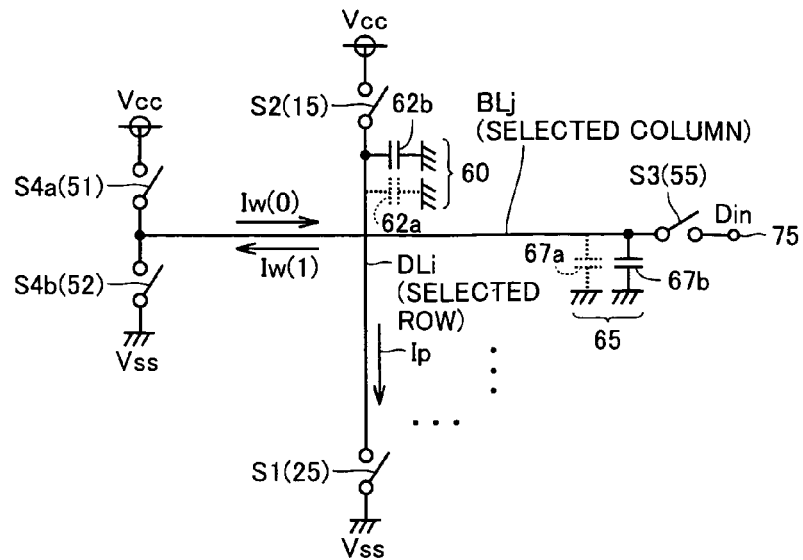
FIG. 4 is a conceptual view illustrating a data write current supply configuration according to the first embodiment of the present invention.

FIG. 4 is a conceptual view illustrating a data write current supply configuration according to the first embodiment of the present invention.

FIG. 4 shows a digit line DLi corresponding to the selected row (hereinafter, also referred to as "selected digit line") and a bit line BLj corresponding to the selected column (hereinafter, also referred to as "selected bit line") as representatives.

As described previously, one end side of selected digit line DLi can be connected to ground voltage Vss through a switching element S1 corresponding to the "first switching element," while the other end side thereof is connected to power supply voltage Vcc through a switching element S2 serving as the "second switching element." It is noted that switching element S1 corresponds to transistor switch 25 shown in FIG. 1, while switching element S2 corresponds to transistor switch 15 shown in FIG. 1.

Reference numeral 60 represents a charge capacitance of digit line DL. Digit line capacitance 60 may be implemented by a parasitic capacitance 62*a* of digit line DL alone, or may be implemented by the sum of a capacitive element (additional capacitor) 62*b* connected to digit line DL and parasitic capacitance 62*a*.

One end side of selected bit line BLj is connected to a write node 75 set to the data voltage in accordance with write data Din through a switching element S3 serving as the "third switching element." Switching element S3 corresponds to column selection switch 55 shown in FIG. 1, and write node 75 corresponds to data terminal 71 or data bus DB in FIG. 1. That is, the data voltage set at write node 75 is either power supply voltage Vcc (Din="H level") or ground voltage Vss (Din="L level").

The other end of bit line BLj can electrically be connected to power supply voltage Vcc and ground voltage Vss corresponding to the "data voltage" through switching elements S4*a*, S4*b* corresponding to the "fourth switching element" respectively. Switching element S4*a* corresponds to transistor switch 51 shown in FIG. 1, and switching element S4*b* corresponds to transistor switch 52 shown in FIG. 1.

Reference numeral 65 represents a charge capacitance of bit line BL. Bit line capacitance 65 may be implemented by a parasitic capacitance 67*a* of bit line BL alone, or may be implemented by the sum of a capacitive element (additional capacitor) 67*b* connected to bit line BL and parasitic capacitance 67*a*.

Figure 5:
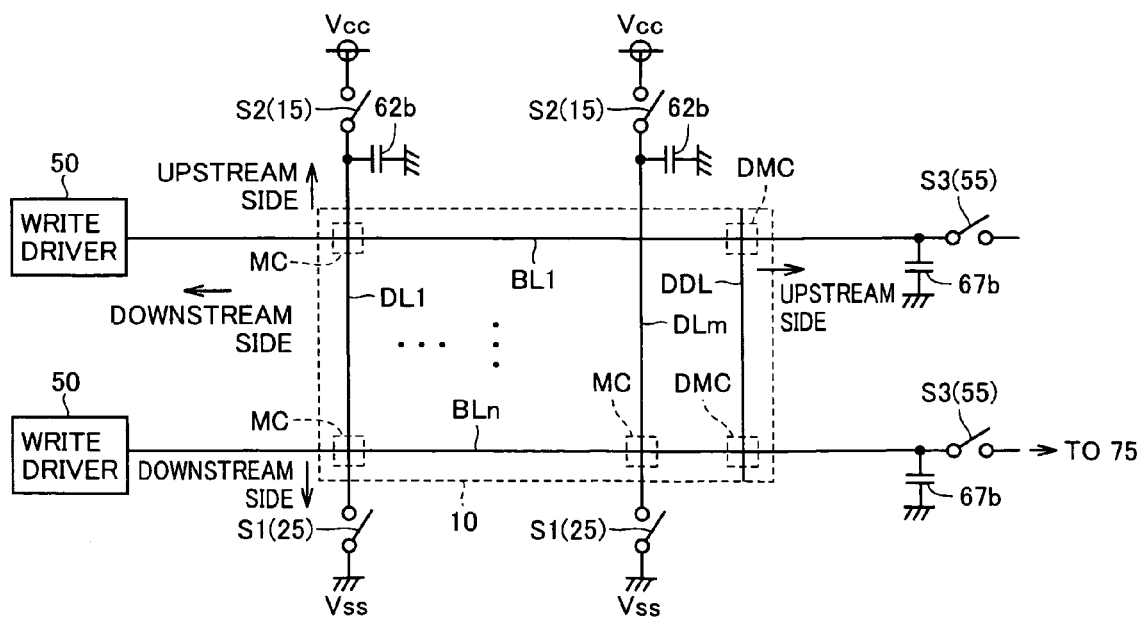
FIG. 5 illustrates a preferable arrangement of an additional capacitor shown in FIG. 4.

FIG. 5 illustrates a preferable arrangement of additional capacitors 62*b*, 67*b*.

Referring to FIG. 5, memory cell array 10 has memory cells MC arranged in m rows and n columns (m, n: natural number). Digit lines DL1 to DLm are arranged corresponding to memory cell rows, and bit lines BL1 to BLn are arranged corresponding to memory cell columns.

In memory cell MC in an upstream side of a path for charging, parasitic capacitances 62*a*, 62*b* that can be utilized for charge storage for data write current supply are smaller than in memory cell MC in a downstream side of the path for charging. In each digit line DL, a switching element S2 side represents the upstream side of the path for charging, while a switching element S1 side represents the downstream side of the path for charging. Similarly, in each bit line BL, a switching element S3 side represents the upstream side of the path for charging, while a write driver 50 side represents the downstream side of the path for charging Therefore, additional capacitors 62*b*, 67*b* for covering a shortfall in the charge capacitances due to parasitic capacitances 62*a*, 67*a* should be provided in the upstream of memory cell MC on the path for charging each digit line DL and each bit line BL. That is, additional capacitor 62*b* is provided such that it is connected to each digit line DL in a region on the switching element S2 side outside memory cell array 10. Similarly, additional capacitor 67*b* is provided such that it is connected to each bit line BL in a region on the switching element S3 side outside memory cell array 10.

FIG. 6 illustrates an operation of the MRAM device according to the first embodiment.

Referring to FIG. 6, it is assumed that the operation of MRAM device 1*a* according to the first embodiment is performed for each clock cycle in response to a clock signal.

In clock cycle 1, a stand-by operation (Stby) is performed, and none of data read and data write is performed. During the stand-by operation, switching elements S2 and S4*b* are turned on, while switching elements S1, S3, and S4*a* are turned off. Though each digit line DL is thus charged with power supply voltage Vcc, the data write current is not produced because switching element S1 is turned off. Similarly, each bit line BL is precharged to ground voltage Vss.

In clock cycle 2, a data read operation (Read) is performed. As each digit line DL is irrelevant to the data read operation, switches S1 and S2 are controlled in a manner the same as in the stand-by operation, and a charged state of each digit line DL is held.

As described in connection with FIG. 1, data read is performed in response to connection of the selected memory cell to the selected bit line. Switching element S3 should be turned off for the data write operation. In the configuration example shown in FIG. 1, however, switching element S3 in the selected column should be turned on because bit line BL is used for both data read and data write. Therefore, in FIG. 6, the state of switching element S3 is shown as "ON" in parentheses. On the other hand, switching elements S4*a*, S4*b* within the write driver are turned off so as not to interfere the data read operation.

In clock cycle 3, the stand-by operation is performed again, in order to start data write from a next cycle.

Clock cycles 4 to 8 constitute a single data write operation. In the single data write operation, either "Write0" for writing data "0" (Din="L level") or "Write1" for writing data "1" (Din="H level") is executed. In the example shown in FIG. 6, it is assumed that "Write0" is executed during clock cycles 4 to 8.

In clock cycle 4, write node 75 is set to a data voltage in accordance with the write data (ground voltage Vss in the case of "Write0").

In clock cycle 4, switching element S3 is turned on, while switching elements S1, S2, S4*a*, and S4*b* are turned off.

As switching element S3 is turned on and switching elements S4*a*, S4*b* are turned off, selected bit line BLj is charged to a data voltage level corresponding to data "0" (Din="L level") (ground voltage Vss).

In addition, selected digit line DLi maintains the state charged to power supply voltage Vcc, and data write current Ip does not flow at this stage. In this manner, in clock cycle 4, digit line capacitance 60 is charged with power supply voltage Vcc, and bit line capacitance 65 is charged to ground voltage Vss in accordance with write data Din.

In next clock cycle 5, switching element S3 is turned off, while switching elements S1 and S4a are turned on. On the other hand, switching elements S2 and S4b maintain the off state.

In this manner, selected digit line DLi in a state charged to power supply voltage Vcc is connected to ground voltage Vss, so that data write current Ip flows in a prescribed direction (a direction from switching element S2 to switching element S1 in this case) on selected digit line DLi. Data write current Ip corresponds to a discharge current from digit line capacitance 60 that has been charged by the time of beginning of clock cycle 4, and it no longer flows when discharging is completed.

In addition, when switching element S4a is turned on, selected bit line BLj in a state charged to the data voltage (ground voltage Vss in this case) in accordance with write data Din is connected to power supply voltage Vcc which is a different data voltage. Then, data write current Iw(0) flows on selected bit line BLj in a direction in accordance with write data Din. Data write current Iw(0) corresponds to a charge current for bit line capacitance 65 toward power supply voltage Vcc, and it no longer flows when charging is completed. Consequently, data "0" is written in the selected memory cell.

In succeeding clock cycle 6, write node 75 is again set to the data voltage in accordance with the write data (ground voltage Vss in the case of "Write0").

In addition, switching element S3 is turned on, while switching elements S1, S2, S4a, and S4b are turned off, as in clock cycle 4. Then, selected bit line BLj is again charged to the data voltage in accordance with the write data (ground voltage Vss), as in clock cycle 4. Meanwhile, since switching elements S1 and S2 are turned off, the state of selected digit line DLi is maintained, as in the end of clock cycle 5.

In succeeding clock cycle 7, switching element S2 is turned on. Then, digit line capacitance 60 is charged to power supply voltage Vcc as in clock cycle 4. On the other hand, as switching element S1 is turned off, data write current Ip does not flow. Moreover, as switching elements S3, S4a, and S4b are turned off, the state of selected bit line BLj is maintained, as in the end of clock cycle 6.

In clock cycle 8, switching elements S1 and S4b are turned on, while switching elements S2, S3, and S4a are turned off. As selected bit line BLj has been charged to ground voltage Vss in clock cycle 7, the data write current does not flow. Therefore, in this clock cycle, though data write current Ip flows on selected digit line DLj, the data write current does not flow on selected bit line BLj. That is, data write is not executed.

In this manner, through the single data write operation constituted of clock cycles 4 to 8, data write current supply in clock cycle 5 allows data write of data "0" (Din="L level").

In clock cycle 9, the stand-by operation similar to that in clock cycles 1 and 3 is performed. That is, each digit line DL is charged to power supply voltage Vcc, while each bit line BL is charged to ground voltage Vss.

Here, the data write operation in accordance with "Write1" is performed by changing the voltage setting at write node 75 in clock cycles 4 and 6 to the data voltage (power supply voltage Vcc) corresponding to Din="H level" and by switching on/off switching elements S1 to S3, S4a, and S4b as in "Write0". Accordingly, in "Write1", the data write current is not produced on selected bit line BLj in clock cycle 5, whereas data write current Iw(1) flows on selected bit line BLj in clock cycle 8, whereby data "1" is written in the selected memory cell.

In other words, in a write operation sequence shown in FIG. 6, in the single write operation constituted of five clock cycles, a switching on/off pattern of switching elements S1 to S3, S4a, and S4b can be made identical, regardless of the write data. As it is not necessary to control the operation of switching elements S4a and S4b in accordance with the write data, the configuration of a circuit to control turn-on/ off, that is, a control circuit generating control signals WDP, WDN shown in FIG. 1, can be simplified.

The data write current in the MRAM device according to the present invention is supplied through the operation for charging/discharging the capacitances of the digit line and the bit line provided as the "write current lines." In the following, a characteristic of the charging/discharging current will be described, using digit line DLi as an example.

Figure 7:
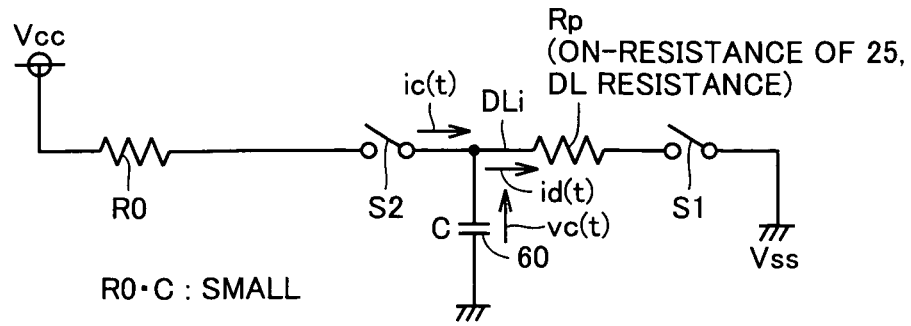
FIG. 7 is a first electric circuit diagram representing a model of a digit line charge/discharge operation in connection with data write current supply.

FIG. 7 is a first electric circuit diagram representing a model of a digit line charge/discharge operation in connection with data write current supply.

Referring to FIG. 7, digit line DLi is connected to power supply voltage Vcc in response to turn-on of switching element S2, during the stand-by operation or the like (clock cycles 1, 3, 7, and 9 in FIG. 6). That is, digit line capacitance 60 is charged with power supply voltage Vcc. This charging operation corresponds to a general operation for charging an RC load. Accordingly, if a charge resistance of the path for charging is denoted by R0, a charge current ic(t) and a digit line voltage vc(t) are expressed as equations (1) and (2). Here, charge resistance R0 includes a parasitic resistance of the path for charging, an on-resistance of transistor switch 15, and the like.

$$vc(t) = Vcc\left\{1 - \exp\left(-\frac{t}{C \cdot R0}\right)\right\} \quad (1)$$

$$ic(t) = C \cdot \frac{dvc(t)}{dt} = \frac{Vcc}{R0} \cdot \exp\left(-\frac{t}{C \cdot R0}\right) \quad (2)$$

By turning on switching element S1 while switching element S2 has been turned off (for example, clock cycles 5, 8 in FIG. 6), charges stored in digit line capacitance 60 are discharged to ground voltage Vss, whereby data write current Ip is fed. If a discharge resistance of the path for discharging is denoted by Rp, a discharge current id(t) and digit line voltage vc(t) are expressed as equations (3) and (4). Here, discharge resistance Rp includes a parasitic resistance of the path for discharging, an on-resistance of transistor switch 25, and the like.

$$vd(t) = vc(0) \cdot \exp\left(-\frac{t}{C \cdot Rp}\right) \quad (3)$$

$$id(t) = C\frac{dvd(t)}{dt} = -\frac{Vc(0)}{Rp} \cdot \exp\left(-\frac{t}{C \cdot Rp}\right) \quad (4)$$

where vc(0)=Vcc

It is noted that ground voltage Vss =0V and Vcc–Vss=Vcc in equations (1) to (4). Schematically illustrated, equations (1) to (4) are as shown in FIGS. 8A and 8B.

Figure 8A:
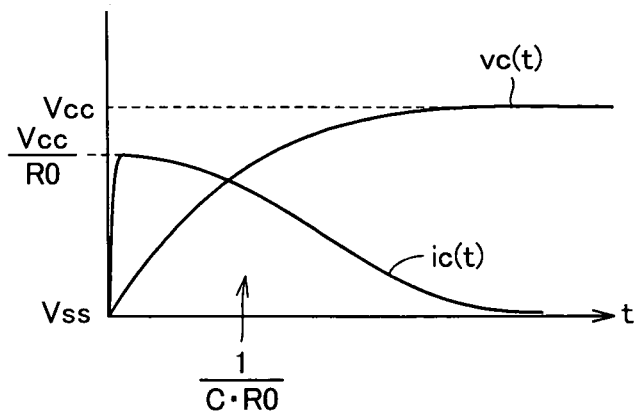
FIGS. 8A and 8B are conceptual views representing waveforms of currents for digit line charge/discharge, respectively.

Referring to FIG. 8A, during charging, charge current ic(t) for digit line capacitance 60 is represented as an attenuation current having a peak value of Vcc/R0 depending on charge resistance R0. An attenuation rate of charge current ic(t) is dependent on "1/(C·R0)", which is a reciprocal of a product of digit line capacitance 60 and charge resistance R0.

Figure 8B:
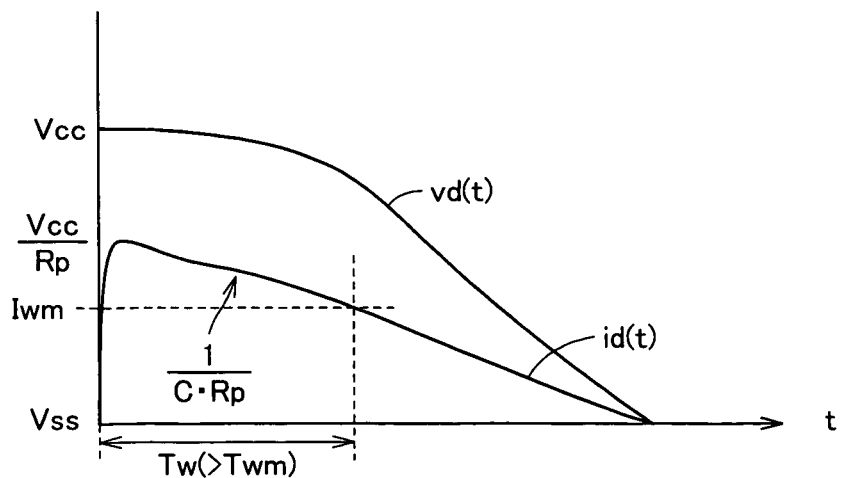

On the other hand, during discharge, as shown in FIG. 8B, discharge current id(t) corresponding to data write current Ip is represented as an attenuation current having a peak value of Vcc/Rp depending on discharge resistance Rp. An attenuation rate of discharge current id(t) is dependent on "1/(C·Rp)", which is a reciprocal of an RC product of digit line capacitance 60 and discharge resistance Rp.

Therefore, if the data write current level necessary for data write is denoted by Iwm and a time period required for applying the current is denoted by Twm, discharge resistance Rp and RC product C·Rp should be designed such that a period Tw attaining discharge current id(t) larger than Iwm (id(t)>Iwm) is longer than Twm (Tw>Twm).

In particular, a capacitance value C of digit line capacitance 60 should be designed at least such that C·(Vcc−Vss) is larger than the product of Iwm and Twm, that is, so as to satisfy equation (5) below.

$$C > \frac{Twm \cdot Iwm}{Vcc - Vss} \quad (5)$$

General numeric value examples are Twm=0.5 to 2(ns) and Iwm=3 to 10(mA). Therefore, if Vcc=1.0(V) and Vss=0V, digit line capacitance 60 should be set approximately to: C=1.5 to 20(pF). As the parasitic capacitance of digit line DL varies depending on the design, capacitive element 62b should additionally be provided and connected to digit line DL, if a capacitance value satisfying equation (5) above cannot be obtained with parasitic capacitance 62a alone shown in FIG. 4. In other words, in order to satisfy equation (5) above, digit line capacitance 60 shown in FIG. 4 is implemented either by parasitic capacitance 62b of digit line DL alone or by the sum of parasitic capacitance 62a and additional capacitor 62b.

In the MRAM device according to the first embodiment, the operation for charging digit line capacitance 60 and the discharge operation for the data write current are performed in different periods, respectively. Therefore, the load current from the power supply (battery) supplying power supply voltage Vcc to the MRAM device corresponds to charge current ic(t) in FIG. 8A. That is, the load current supplied from the power supply can have a relatively gentle waveform.

On the other hand, in the configuration shown in FIG. 7, switching element S2 alone may be provided without providing switching element S1, and switching element S2 alone may be turned on/off in accordance with a result of row selection so as to supply data write current Ip. With such a configuration, however, steady data write current Ip=(Vcc−Vss)/(R0+Rp) is supplied from the power supply throughout the on period of switching element S2, and the charge current for digit line capacitance 60 is further supplied in a superposed manner during an initial stage of the on period. Therefore, the load current supplied from the power supply exhibits a shorter-period, larger-current waveform than charge current ic(t) shown in FIG. 8A, and its peak value is also raised. Accordingly, the power supply such as the battery bears a larger load, and the electric power supply period may be shortened.

In other words, with the MRAM device according to the first embodiment of the present invention, load imposed on the power supply (battery) can be mitigated by improving the load current supplied from the power supply such that the load current exhibits a gentle waveform.

Figure 9:
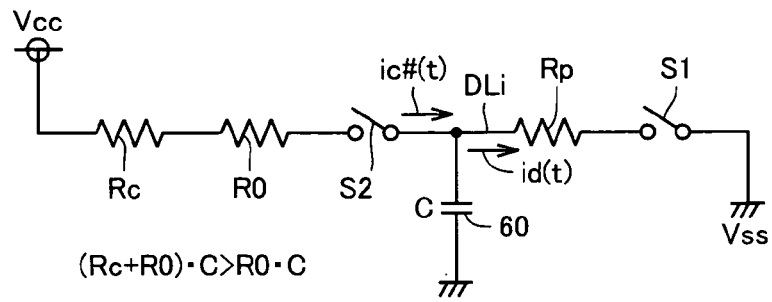
FIG. 9 is a second electric circuit diagram representing a model of a digit line charge/discharge operation in connection with data write current supply.

In addition, as shown in FIG. 9, a larger RC product of the path for charging can be obtained by inserting a charge adjusting resistor Rc in the path for charging digit line capacitance 60. This is because charge adjusting resistor Rc is disconnected from the data write current path during the data write current Ip supply period by arranging switching element S2. With respect to digit line DL, charge adjusting resistor Rc shown in FIG. 9 should be arranged so as to be connected between power supply voltage Vcc (corresponding to the battery) and transistor switch 15 shown in FIG. 1.

A charge current ic#(t) in the configuration in FIG. 9 is as shown in equation (6) below.

$$ic\#(t) = \frac{Vcc}{R0 + Rc} \cdot \exp\left(-\frac{t}{C \cdot (R0 + Rc)}\right) \quad (6)$$

As can be seen from comparison of charge current ic(t) in equation (2) with charge current ic#(t) in equation (6), addition of charge adjusting resistor Rc can serve for suppression of the peak value of the load current supplied from the power supply and improvement in its waveform to a further gentle waveform. Therefore, though the time for charging may be extended, load imposed on the power supply (battery) can further be mitigated, if applied to the use in which a high-speed operation is not required.

Figure 10:
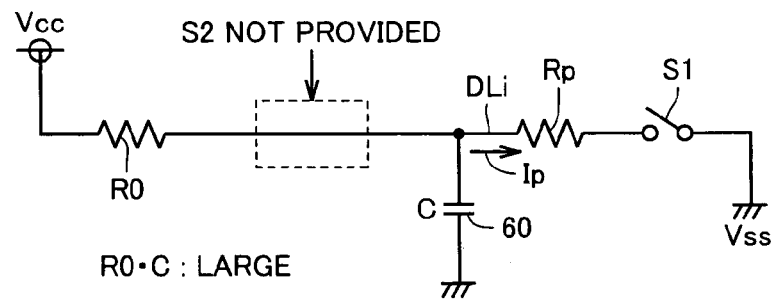
FIG. 10 is a third electric circuit diagram representing a model of a digit line charge/discharge operation in connection with data write current supply.

Alternatively, as shown in FIG. 10, if sufficient capacitance value C of digit line capacitance 60 is ensured and the RC product of the capacitance value and charge resistance R0, i.e., R0·C, is sufficiently large, switching element S2 may not be provided. In such a configuration, though charge current ic(t) flows in a manner the same as in the configuration in FIG. 7, a discharge current id#(t), that is, data write current Ip that flows in response to turn-on of switching element S1 is expressed as equation (7) below.

$$id\#(t) = \frac{Vcc - Vss}{R0 + Rp} \quad (7)$$

While switching element S1 is turned on, the power supply (battery) covers a shortfall in data write current id#(t) shown in equation (7), that digit line capacitance 60 failed to supply using the discharged charges. Accordingly, in the configuration shown in FIG. 10, though load imposed on the power supply (battery) increases by an amount of the shortfall in the current during the data write current supply period (on-period of switching element S1), the configuration in which a part of the data write current is supplied by the stored charges prior to the data write current supply period is the same. Therefore, load imposed on the power supply (battery) can be mitigated.

Though the data write current supply operation on digit line DL has been described in connection with FIGS. 7 to 10, the same description also applies to the charge current and the discharge current in the data write current supply operation on bit line BL.

Figure 11:
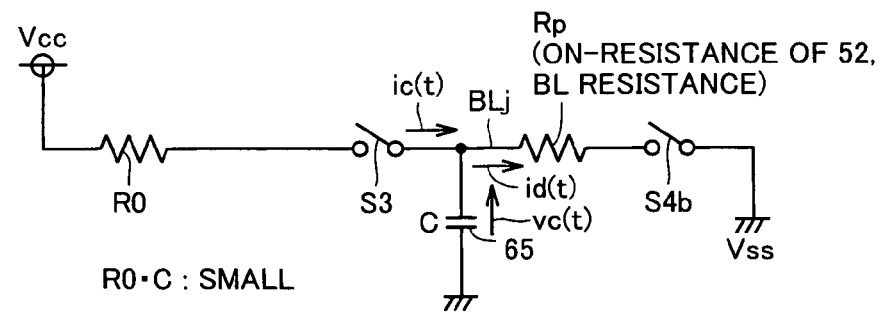
FIG. 11 is a first electric circuit diagram representing a model of a bit line charge/discharge operation in connection with data write current supply.
Figure 12:
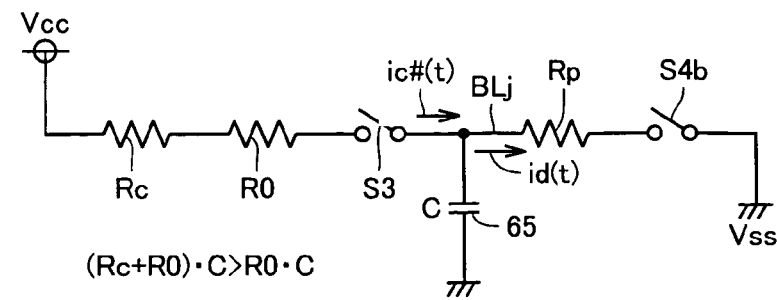
FIG. 12 is a second electric circuit diagram representing a model of a bit line charge/discharge operation in connection with data write current supply.

Specifically, as shown in FIGS. 11 and 12, switching element S2 is replaced with switching element S3 (column selection switch 55), switching element S1 is replaced with switching elements S4a, S4b, and digit line capacitance 60 is replaced with bit line capacitance 65 in the configuration in FIGS. 7 and 9. Then, an electric circuit diagram representing a model of the bit line charge/discharge operation in connection with data write current supply is obtained.

During the data write current supply operation on bit line BL, an operation for discharging bit line capacitance 65 that has been charged to power supply voltage Vcc to ground voltage Vss (corresponding to supply of data write current Iw(1)) and an operation for charging bit line capacitance 65 with power supply voltage Vcc after it is set to ground voltage Vss (corresponding to supply of data write current Iw(0)) are performed.

In such operations, however, though the waveform of voltage vc(t) in FIGS. 8A and 8B has the polarity reversed, charge currents ic(t), ic#(t) and discharge currents id(t), id#(t) exhibit waveforms similar to those in the data current supply operation on the digit line described above. Therefore, load imposed on the power supply (battery) can be mitigated also in the data write current supply on the bit line, as in the data write current supply on the digit line.

Charge adjusting resistor Rc in connection with the data current supply operation on bit line BL can be arranged between switching element S3 and data terminal 71 shown in FIG. 1 in a manner connected in series to bit line BL during the on period of switching element S3.

In addition, charge resistance R0 corresponds to the sum of the parasitic resistance on the charge path from write buffer 70 to bit line BL and the on-resistance of switching element S3, while discharge resistance Rp corresponds to the sum of the parasitic resistance of bit line BL and the on-resistance of switching element S4a or S4b.

As described above, in the MRAM device according to the first embodiment of the present invention, the operation for charging a capacitance of digit line DL and bit line BL corresponding to the "write line" for supplying data write current Ip and Iw(0), Iw(1) and the data write current supply operation are performed in a time-divided manner, and the data write current is supplied by discharging the charges that have been stored in the capacitance. In this manner, the load current supplied from the power supply (battery) supplying power supply voltage Vcc to the MRAM device can have a gentle waveform, whereby load imposed on the battery can be mitigated. Consequently, the period for electric power supply from the power supply (battery) can be extended, and a time period for which equipment incorporating the MRAM device can be driven can be extended.

In particular, charge adjusting resistor Rc can be inserted without adversely affecting the level of the data write current by providing switching element S2. Therefore, the period for electric power supply by means of the power supply (battery) can further be extended in an application where there is no disadvantageous effect on the operation time period required as a result of the extended time period for charging.

First Variation of First Embodiment

In a first variation of the first embodiment, another configuration example of the data write operation sequence in the MRAM device according to the first embodiment will be described.

FIG. 13 illustrates an operation of the MRAM device according to the first variation of the first embodiment.

Referring to FIG. 13, in the data write operation according to the variation of the first embodiment, a single data write operation is constituted of two clock cycles. In the single data write operation, either "Write0" for writing data "0" or "Write1" for writing data "1" is executed. In FIG. 13, as in the operation sequence shown in FIG. 6, the stand-by operation (Stby), the read operation (Read), and the stand-by (Stby) operation are performed in clock cycles 1 to 3, respectively.

Clock cycles 4 and 5 constitute the single data write operation (Write0) for writing data "0".

In clock cycle 4, an operation the same as in clock cycle 4 shown in FIG. 6 is performed, and selected bit line BLj is charged to ground voltage Vss in accordance with write data Din by write node 75. In addition, in clock cycle 4, selected digit line DLi maintains the state charged to power supply voltage Vcc.

In next clock cycle 5, switching elements S1 and S2 are controlled in a manner the same as in clock cycle 5 shown in FIG. 6.

Then, data write current Ip flows on selected digit line DLi. Moreover, as switching element S3 is also turned off as in clock cycle 4 shown in FIG. 6, selected bit line BLj is disconnected from write node 75 set to a high impedance state (Z).

In the data write operation according to the variation of the first embodiment, turn-on/off of switching elements S4a and S4b constituting write driver 50 (FIG. 1) is controlled in accordance with write data Din. In clock cycle 5, switching element S4a is turned on while switching element S4b is turned off in accordance with Din="L level". Accordingly, since selected bit line BLj charged to ground voltage Vss in accordance with write data Din is connected to power supply voltage Vcc by switching element S4a, data write current Iw(0) flows on selected bit line BLj. Data "0" is thus written in the selected memory cell.

The stand-by operation in clock cycle 6 is similar to that in clock cycles 1 and 3.

Clock cycles 7 and 8 constitute the single data write operation (Write1) for writing data "1".

In clock cycle 7, an operation similar to that in clock cycle 4 is performed. That is, selected digit line DLi is charged to power supply voltage Vcc, and selected bit line BLj is charged to power supply voltage Vcc in accordance with write data Din by write node 75.

In next clock cycle 8, as in clock cycle 4 in FIG. 13, data write current Ip flows on selected digit line DLi. Moreover, since switching element S3 is also turned off as in clock cycle 4 shown in FIG. 6, selected bit line BLj is disconnected from write node 75 set to high impedance state (Z).

In addition, switching element S4b is turned on while switching element S4a is turned off in accordance with Din="H level". That is, the on/off states of switching elements S4a and S4b are reversed in the data write operations in which different types of write data are employed respectively. Accordingly, selected bit line BLj charged to power supply voltage Vcc in accordance with write data Din is connected to ground voltage Vss by switching element S4b. Consequently, data write current Iw(1) flows on selected bit line BLj, and data "1" is written in the selected memory cell in clock cycle 8.

As the stand-by operation in next clock cycle 9 is the same as that in clock cycles 1, 3, and 6, description thereof will not be repeated.

As described above, in the data write operation according to the variation of the first embodiment, the configuration similar to that in the MRAM device according to the first embodiment is employed in order to mitigate the load imposed on the power supply (battery) in connection with data write current supply, as well as to shorten clock cycles required for the data write operation. Therefore, a high-speed operation can be achieved.

Such a high-speed operation is achieved by the configuration in which turn-on/off of switching elements S4a, S4b constituting the write driver is controlled in accordance with write data Din. Therefore, in the configuration according to the variation of the first embodiment, the control circuit should be configured such that control signals WDP and WDN shown in FIG. 1 are controlled in accordance with write data Din. Accordingly, the configuration according to the variation of the first embodiment has a relatively complicated configuration of the control circuit, however, it is suitable for an application requiring a high-speed operation.

Second Variation of First Embodiment

In a second variation of the first embodiment, a configuration capable of reducing the number of clock cycles necessary for the data write operation while maintaining a pattern of on/off control of each switching element during the data write operation by adding a switching element for controlling the data write current to the configuration of the MRAM device according to the first embodiment will be described.

Figures 14, 15:
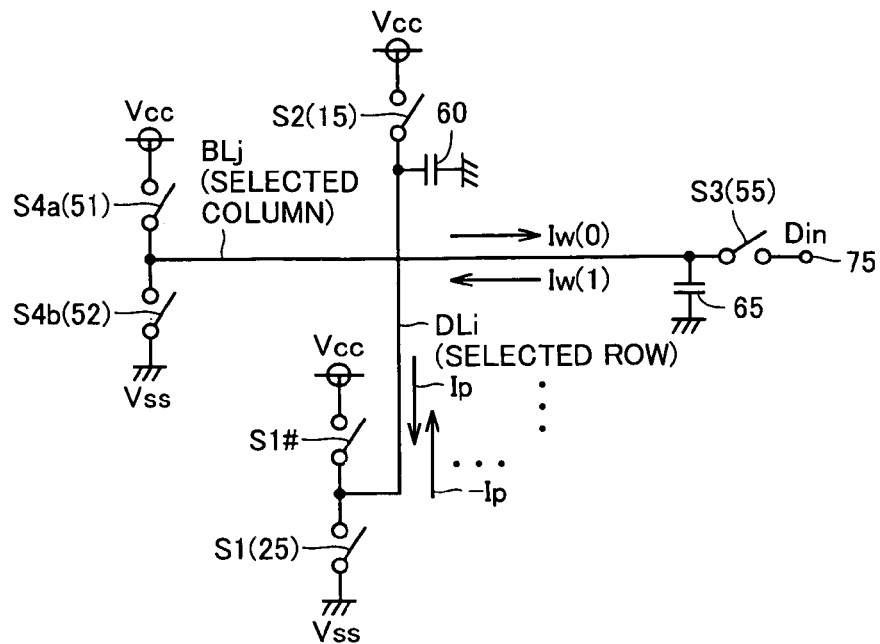
FIG. 14 is a conceptual view illustrating a data write current supply configuration according to a second variation of the first embodiment of the present invention.
FIG. 15 illustrates an operation of the MRAM device according to the second variation of the first embodiment.

FIG. 14 is a conceptual view illustrating a data write current supply configuration according to the second variation of the first embodiment of the present invention.

Referring to FIG. 14, in the configuration according to the second variation of the first embodiment, a switching element S1# corresponding to a "sub switching element" is further provided on one end side of each digit line DL where switching element S1 is provided. Switching element S1# is electrically connected between one end of each digit line DL and power supply voltage Vcc. Accordingly, one end side of each digit line DL can be connected to ground voltage Vss through switching element. S1, as well as to power supply voltage Vcc through switching element S1#.

As the configuration in the second variation is otherwise similar to that in the first embodiment shown in FIG. 4, detailed description thereof will not be repeated.

FIG. 15 illustrates an operation of the MRAM device according to the second variation of the first embodiment.

Referring to FIG. 15, in a data write operation in the configuration according to the second variation of the first embodiment, a single data write operation constituted of three clock cycles is performed.

During the stand-by operation (Stby) performed in clock cycles 1, 3 and 8, switching element S1# is turned off similarly to switching element S1. In the data read operation (Read) shown in clock cycle 2 as well, switching element S1# is turned on similarly to switching element S1.

As the on/off setting of switching elements S1 to S3, S4a, and S4b during the stand-by operation and the data read operation is the same as in the MRAM device according to the first embodiment shown in FIG. 6, detailed description thereof will not be repeated.

Clock cycles 4 to 7 constitute the single data write operation. In the single data write operation, either "Write0" for writing data "0" (Din="L level") or "Write1" for writing data "1" (Din="H level") is executed. In the example shown in FIG. 6, it is assumed that "Write0" is executed in clock cycles 4 to 7.

In clock cycle 4, i.e., the first cycle in the data write operation, switching element S1# remains turned-off. Therefore, as in the data write operation according to the first embodiment, digit line DL is charged to power supply voltage Vcc, while selected bit line BLj is charged to ground voltage Vss which is the data voltage in accordance with write data Din.

In next clock cycle 5, data write current Ip flows on selected digit line DLi in response to turn-on of switching element S1. In addition, switching element S4a is turned on in order to feed data write current Iw(0), so that data write current Iw(0) flows on selected bit line BLj that has been charged to ground voltage Vss in advance. Data "0" is thus written in the selected memory cell.

In clock cycle 6, as in clock cycle 6 in FIG. 6, an operation for re-charging selected bit line BLj to the data voltage (ground voltage Vss) in accordance with the write data is performed. That is, write node 75 is again set to the data voltage in accordance with the write data (ground voltage Vss in the case of "Write0"). In addition, switching element S3 is turned on, and switching elements S1, S1#, S2, S4a, and S4b are turned off as in clock cycle 4.

In succeeding clock cycle 7, newly-provided switching element S1 # is turned on while the off state of switching element S2 is maintained. On the other hand, switching elements S3, S4a, and S4b are set in a manner the same as in clock cycle 8 in FIG. 6, and an operation for feeding data write current Iw(1) is performed.

Digit line DLi set to ground voltage Vss through the discharging operation in clock cycle 5 is again connected to power supply voltage Vcc and recharged in response to turn-on of switching element S1#. A current produced by re-charging allows a data write current −Ip to flow on selected digit line DLi in a direction opposite to that in clock cycle 4.

In clock cycle 7, though switching element S4b is turned on, it is ground voltage Vss that is set at write node 75 as the data voltage. Therefore, the data write current does not flow on bit line BL in this clock cycle. Accordingly, in this clock cycle, though data write current −Ip flows on selected digit line DLj, the data write current does not flow on selected bit line BLj, whereby data write is not carried out.

In clock cycle 8, the stand-by (Stby) operation the same as in clock cycles 1 and 3 is performed.

The data write operation in accordance with "Write1" is performed by changing the voltage setting at write node 75 in clock cycles 4 and 6 to the data voltage (power supply voltage Vcc) corresponding to Din="H level" and by switching on/off switching elements S1 to S3, S4a, and S4b as in "Write0". Accordingly, in "Write1", the data write current is not produced on selected bit line BLj in clock cycle 5, whereas data write current Iw(1) flows on selected bit line BLj in clock cycle 7.

Consequently, a write magnetic field produced by data write current −Ip and a write magnetic field produced by data write current Iw(1) are applied to the selected memory cell in clock cycle 7. Then, data write of data "1" (Din="H level") into the selected memory cell is carried out. As described in connection with FIG. 3, data write into the MTJ memory cell is determined depending on the direction of data write magnetic field H(EA) along the easy axis. Therefore, the same data can be written by using any of operation points 5a and 5c (or operation points 5b and 5d) shown in FIG. 5.

As described above, in the configuration according to the second variation of the first embodiment, the operation for charging the capacitance of digit line DL and bit line BL and the data write current supply operation are performed in a time-divided manner as in the first embodiment. Therefore, the load current supplied from the power supply (battery) to the MRAM device can have a gentle waveform, and load imposed on the battery can be mitigated.

In addition, in the configuration according to the second variation of the first embodiment, the on/off setting of each switching element during the data write operation is held as a pattern as in the first embodiment, so as to simplify the configuration of the control circuit of write driver 50. Moreover, the number of clock cycles necessary for the data write operation is reduced, and higher speed in data write can be achieved.

Second Embodiment

As described in the first embodiment, in the MRAM device according to the present invention, sufficient charge capacitance of digit line DL and bit line BL should be obtained in order to ensure an amount of data write current and the current supply period. In a second embodiment, a configuration to obtain the charge capacitance using a hierarchically higher write line provided hierarchically with respect to digit line DL and bit line BL will be described.

Figure 16:
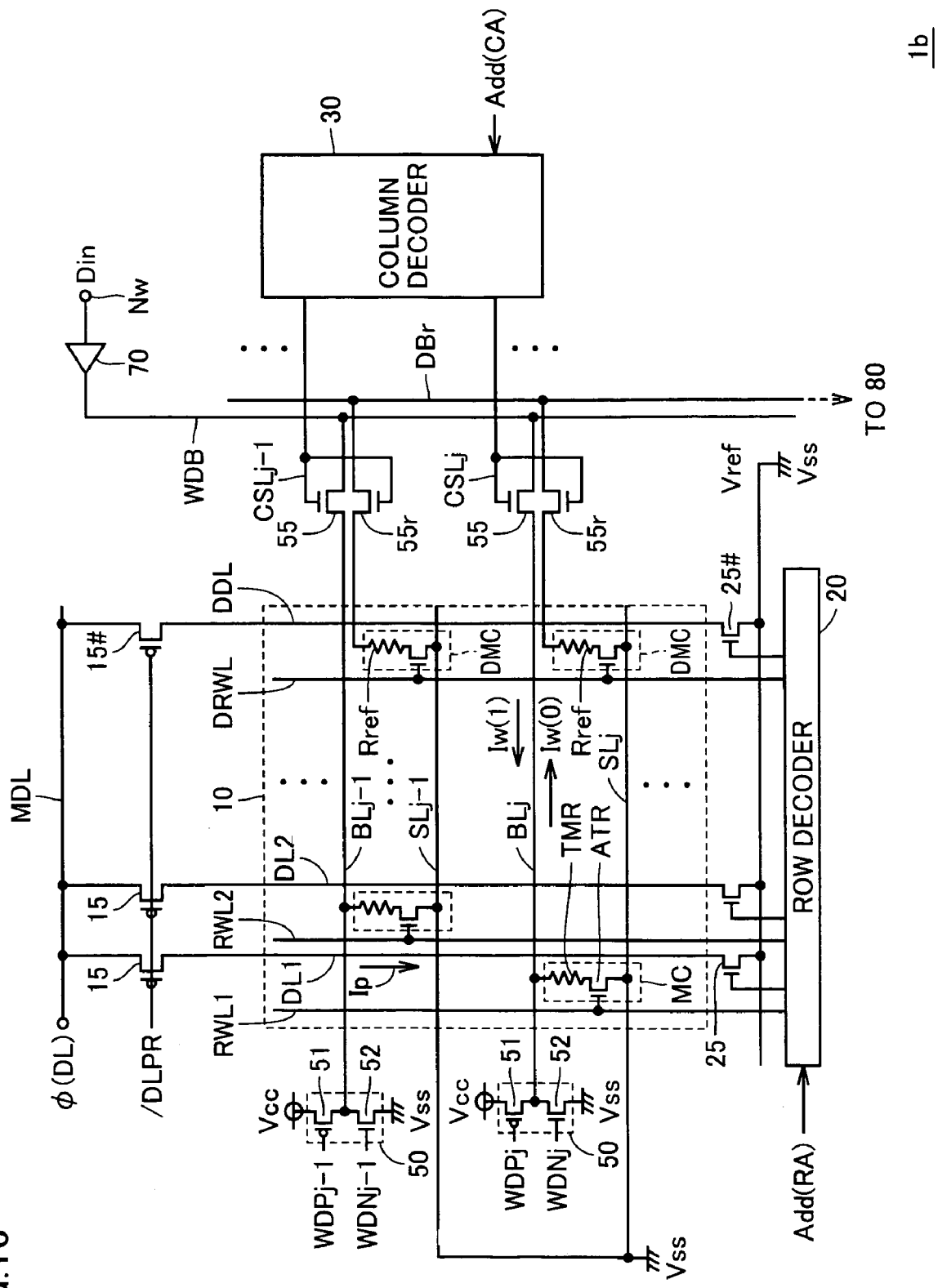
FIG. 16 is a schematic block diagram showing an overall configuration of an MRAM device according to a second embodiment of the present invention.

FIG. 16 is a schematic block diagram showing an overall configuration of an MRAM device 1*b* according to the second embodiment of the present invention.

When FIG. 16 is compared with FIG. 1, in MRAM device 1*b* according to the second embodiment, each digit line DL is connected to a main digit line MDL through transistor switch 15. Main digit line MDL represents a "hierarchically higher write line" commonly and hierarchically provided with respect to digit lines DL. A voltage signal φ(DL) is applied to main digit line MDL.

In addition, a write data bus WDB dedicated for data write is arranged, instead of data bus DB used for both data read and data read. Write data bus WDB represents a "hierarchically higher write line" commonly and hierarchically provided with respect to bit lines BL.

Write buffer 70 drives write data bus WDB to the data voltage in accordance with write data Din. Write data bus WDB is connected to each bit line BL through column selection switch 55 in each memory cell column.

Though not shown, data read amplifier 80 as in FIG. 1 is provided, and a read data bus (not shown) for data read connected to the data read amplifier is further provided. The read data bus is connected to each bit line BL through a read column selection switch S3# (not shown) provided independently of column selection switch 55 connected to write data bus WDB. Each read column selection switch S3# is turned off during the data write operation, while it is turned on in the selected column in response to column selection line CSL during the data read operation. In this manner, data read can be carried out by using the disconnected read data bus instead of data bus DB in FIG. 1.

By disconnecting write data bus WDB from the data read path as above, its capacitance can be adjusted in a manner adapted to the data write operation. Stated differently, if the capacitance of data bus DB is increased in order to ensure the data write current in such a configuration that data bus DB is used for both data read and data write as shown in FIG. 1, a speed of the data read operation is impaired.

As the configuration of MRAM device 1*b* according to the second embodiment is otherwise similar to that of MRAM device 1*a* (FIG. 1) according to the first embodiment, detailed description thereof will not be repeated.

Figures 17, 18:
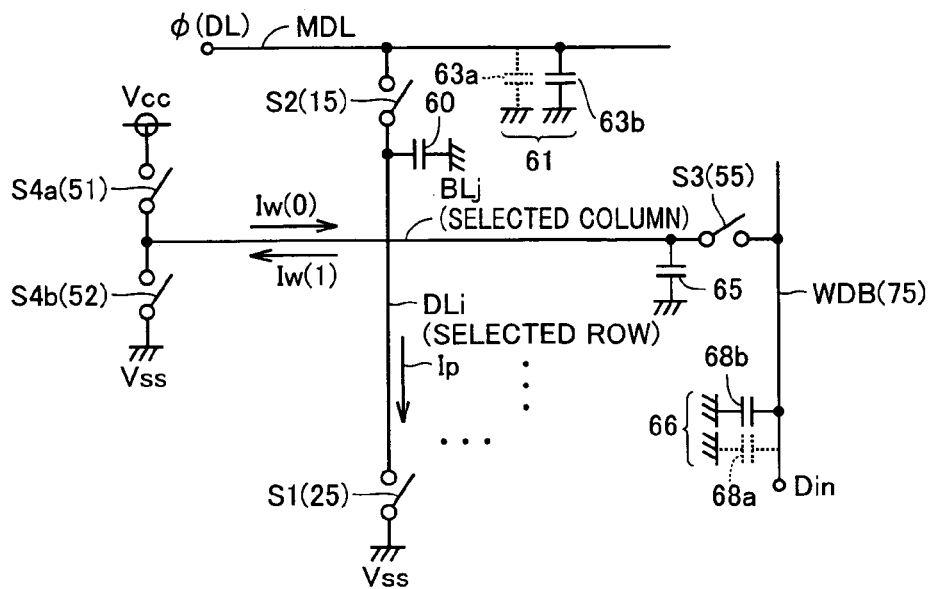
FIG. 17 is a conceptual view illustrating a data write current supply configuration according to the second embodiment of the present invention.
FIG. 18 illustrates an operation of the MRAM device according to the second embodiment.

FIG. 17 is a conceptual view illustrating a data write current supply configuration according to the second embodiment of the present invention.

Referring to FIG. 17, in the data write current supply configuration according to the second embodiment, each digit line represented by selected digit line DLi is connected to main digit line MDL through switching element S2 (transistor switch 15). Reference numeral 61 represents a charge capacitance of main digit line MDL. Main digit line capacitance 61 may be implemented by a parasitic capacitance 63*a* of main digit line MDL alone, or may be implemented by the sum of a capacitive element (additional capacitor) 63*b* connected to main digit line MDL and parasitic capacitance 63*a*.

In addition, each bit line BL represented by selected bit line BLj is connected to write data bus WDB through switching element S3 (column selection switch 55). In the configuration according to the second embodiment, write data bus WDB corresponds to write node 75.

Reference numeral 66 represents a charge capacitance of write data bus WDB. Write data bus capacitance 66 may be implemented by a parasitic capacitance 68*a* of write data bus WDB alone, or may be implemented by the sum of a capacitive element (additional capacitor) 68*b* connected to write data bus WDB and parasitic capacitance 68*a*.

As the data write current supply configuration according to the second embodiment is otherwise similar to that according to the first embodiment shown in FIG. 4, detailed description thereof will not be repeated.

FIG. 18 illustrates an operation of the MRAM device according to the second embodiment.

An operation sequence shown in FIG. 18 corresponds to the operation sequence according to the first embodiment shown in FIG. 6, and an operation in clock cycles 1 to 9 is similar to that shown in FIG. 6.

That is, the stand-by operation (Stby) as in FIG. 6 is performed in clock cycles 1, 3 and 9, and the data read operation (Read) as in FIG. 6 is performed in clock cycle 2. Read column selection switch S3# is turned on in the selected bit line in clock cycle 2, while it is turned off in each bit line BL during the stand-by operation and the data write operation.

Clock cycles 4 to 8 constitute a single data write operation (Write0 or Write1) for writing data "0" or data "1".

In the data write operation according to the second embodiment, the on state of switching element S2 in the selected row is maintained, except for during clock cycle 6 in which selected bit line BLj is re-charged in order to integrally use main digit line capacitance 61 with capacitance 60 of selected digit line DLi. The on state of switching element S3 in the selected column is maintained in order to integrally use write data bus capacitance 66 with capacitance 65 of selected bit line BLj. On the other hand, as other switching elements S1, S4*a*, and S4*b* operate in a manner the same as in the first embodiment shown in FIG. 6, detailed description thereof will not be repeated.

Voltage signal φ(DL) provided to main digit line MDL is set to power supply voltage Vcc during clock cycles 1 to 3 and 9 in which the stand-by operation (Stby) and the data read operation (Read) are performed as well as during a cycle for charging digit line DL in the data write operation (clock cycles 4 and 7), and it is set to high impedance state (Z) in other clock cycles.

With such a data write sequence, the data write operation similar to that in MRAM device 1*a* according to the first embodiment can be performed also in the MRAM device according to the second embodiment. That is, the pattern of the load current supplied from the power supply (battery) of the MRAM device can be improved to a gentle waveform, and the period for electric power supply from the power supply (battery) can be extended.

In addition, in the configuration according to the second embodiment, as the capacitance of the main digit line MDL and write data bus WDB provided as the hierarchically higher write line can be utilized as the charge capacitance of the digit line DL and bit line BL, the charge capacitance can more readily be ensured, and increase in the circuit area due to provision of the additional capacitor can be avoided.

First Variation of Second Embodiment

In the MRAM device according to the second embodiment, as in the first variation of the first embodiment, switching elements S4a and S4b constituting the write driver can be controlled in accordance with write data Din, so as to accelerate the data write operation.

Figures 19, 20:
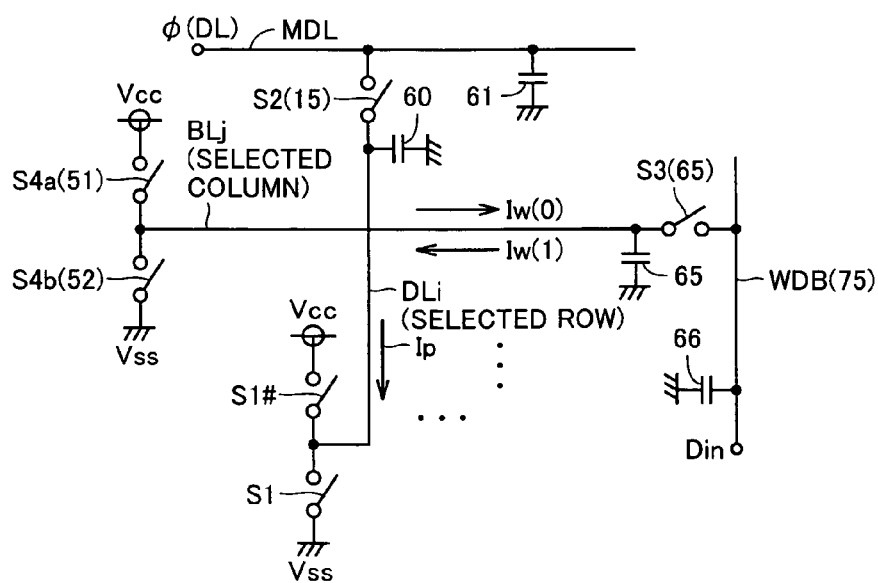
FIG. 19 illustrates an operation of the MRAM device according to a first variation of the second embodiment.
FIG. 20 is a conceptual view illustrating a data write current supply configuration according to a second variation of the second embodiment of the present invention.

FIG. 19 illustrates an operation of the MRAM device according to a first variation of the second embodiment.

An operation sequence shown in FIG. 19 corresponds to the operation sequence according to the first variation of the first embodiment shown in FIG. 13, and an operation in clock cycles 1 to 9 is similar to that shown in FIG. 13.

That is, the stand-by operation (Stby) as in FIG. 13 is performed in clock cycles 1, 3, 6, and 9, and the data read operation (Read) as in FIG. 18 is performed in clock cycle 2. Clock cycles 4 and 5 constitute a single data write operation (Write0) for writing data "0", and clock cycles 7 and 8 constitute a single data write data operation (Write1) for writing data "1".

In the data write operation according to the first variation of the second embodiment, the on state of switching element S2 in the selected row is maintained in order to integrally use main digit line capacitance 61 with capacitance 60 of selected digit line DLi. Similarly, the on state of switching element S3 in the selected column is maintained in order to integrally use write data bus capacitance 66 with capacitance 65 of selected bit line BLj. On the other hand, as the operation of other switching elements S1, S4a, and S4b and the setting of write node 75 are the same as in the first variation of the first embodiment shown in FIG. 13, detailed description thereof will not be repeated.

Voltage signal φ(DL) provided to main digit line MDL is set to power supply voltage Vcc during clock cycles 1 to 3, 6, and 9 in which the stand-by operation (Stby) and the data read operation (Read) are performed as well as during a cycle for charging digit line DL in the data write operation (clock cycles 4 and 7), and it is set to high impedance state (Z) in other clock cycles.

With such a data write operation sequence, the data write operation can be accelerated in the MRAM device according to the second embodiment, as in the configuration according to the first variation of the first embodiment.

Second Variation of Second Embodiment

FIG. 20 is a conceptual view illustrating a data write current supply configuration according to a second variation of the second embodiment of the present invention.

Referring to FIG. 20, the data write current supply configuration according to the second variation of the second embodiment is different from the data write configuration according to the second variation of the first embodiment shown in FIG. 14 in that each digit line DL is connected to main digit line MDL through switching element S2 and that each bit line BL is connected to write data bus WDB through switching element S3. Main digit line MDL receives voltage signal φ(DL) similar to that in the second embodiment, and the capacitances of main digit line MDL and write data bus WDB are denoted by reference numerals 61 and 66, respectively.

As the data write current supply configuration according to the second variation of the second embodiment is otherwise similar to that according to the second variation of the first embodiment shown in FIG. 14, detailed description thereof will not be repeated.

FIG. 21 illustrates a data write operation sequence in the MRAM device according to the second variation of the second embodiment.

The operation sequence shown in FIG. 21 corresponds to the operation sequence according to the second variation of the first embodiment shown in FIG. 15, and an operation in clock cycles 1 to 8 is similar to that shown in FIG. 15.

That is, the stand-by operation (Stby) as in FIG. 15 is performed in clock cycles 1, 3 and 8, and the data read operation (Read) as in FIG. 15 is performed in clock cycle 2. In addition, clock cycles 4 to 7 constitute a single data write operation (Write0 or Write1) for writing data "0" or data "1".

In the data write operation according to the second variation of the second embodiment as well, the on state of switching element S2 in the selected row is maintained in order to integrally use main digit line capacitance 61 with capacitance 60 of selected digit line DLi. Similarly, the on state of switching element S3 in the selected column is maintained in order to integrally use write data bus capacitance 66 with capacitance 65 of selected bit line BLj. On the other hand, as the operation of other switching elements S1, S1#, S4a, and S4b is the same as in the operation sequence according to the second variation of the first embodiment shown in FIG. 15, detailed description thereof will not be repeated.

Voltage signal φ(DL) provided to main digit line MDL is set to power supply voltage Vcc during clock cycles 1 to 3 and 8 in which the stand-by operation (Stby) and the data read operation (Read) are performed as well as during a cycle for charging digit line DL in the data write operation (clock cycle 4), and it is set to high impedance state (Z) in other clock cycles.

With such a data write sequence, in the MRAM device according to the second variation of the second embodiment, as in the configuration according to the second variation of the first embodiment, the on/off setting of each switching element during the data write operation is held as a pattern, and the configuration of the control circuit of write driver 50 is simplified. In addition, the number of clock cycles necessary for the data write operation is reduced, and a higher speed in data write can be achieved.

Though main digit line MDL common to each digit line DL is provided in the second embodiment and the first and second variations thereof, main digit line MDL may be arranged in a divided manner, in order to adjust main digit line capacitance 61.

Figure 22:
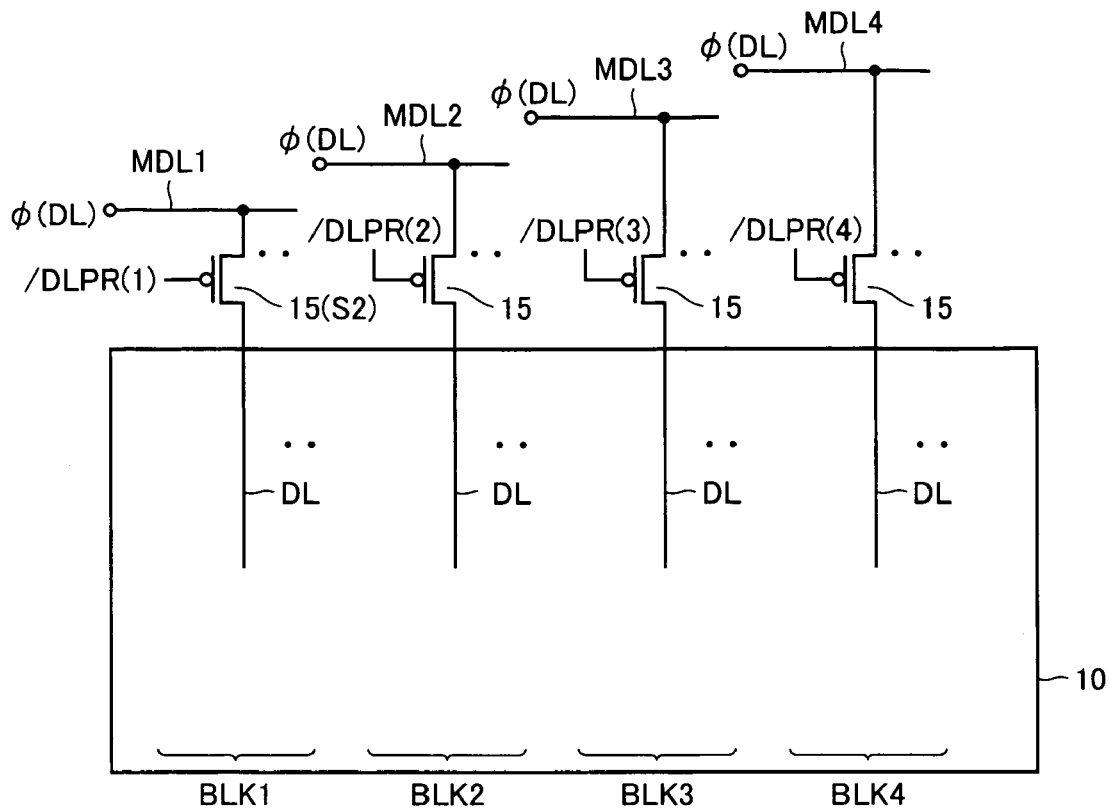
FIG. 22 is a conceptual view illustrating arrangement of a main digit line in a divided manner, applicable to the second embodiment as well as to the first and second variations thereof.

For example, as shown in FIG. 22, digit lines DL arranged in memory cell array 10 may be divided into a plurality of blocks (for example, four blocks) BLK1 to BLK4, and main digit lines MDL1 to MDL4 are arranged corresponding to blocks BLK1 to BLK4 respectively. The number of resultant sections of main digit line MDL may be determined as appropriate, such that a desired capacitance value of each divided main digit line is obtained.

Here, control signal /DLPR controlling on/off of transistor switch 15 is independently set as /DLPR(1) to /DLPR(4) corresponding to blocks BLK1 to BLK4 respectively, so that voltage signal φ(DL) for main digit lines MDL1 to MDL4 can commonly be provided.

Third Variation of Second Embodiment

In the MRAM device according to the second embodiment, the charge capacitance of digit line DL supplying the data write current in a constant direction regardless of write data Din is more readily ensured. Therefore, as described with reference to FIG. 10, it is not necessary to provide switching element S2 for controlling an operation for charging each digit line DL.

Figure 23:
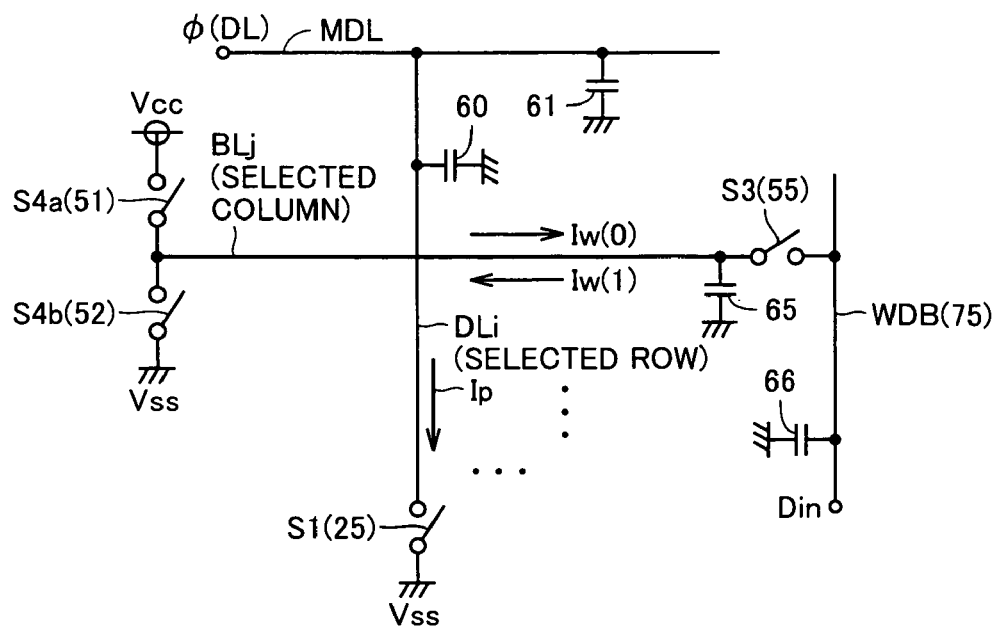
FIG. 23 is a conceptual view illustrating a data write current supply configuration according to a third variation of the second embodiment of the present invention.

FIG. 23 is a conceptual view illustrating a data write current supply configuration according to a third variation of the second embodiment of the present invention.

Referring to FIG. 23, the data write current supply configuration according to the third variation of the second embodiment is similar to that according to the second embodiment shown in FIG. 17, except for absence of switching element S2.

Figures 24, 25:
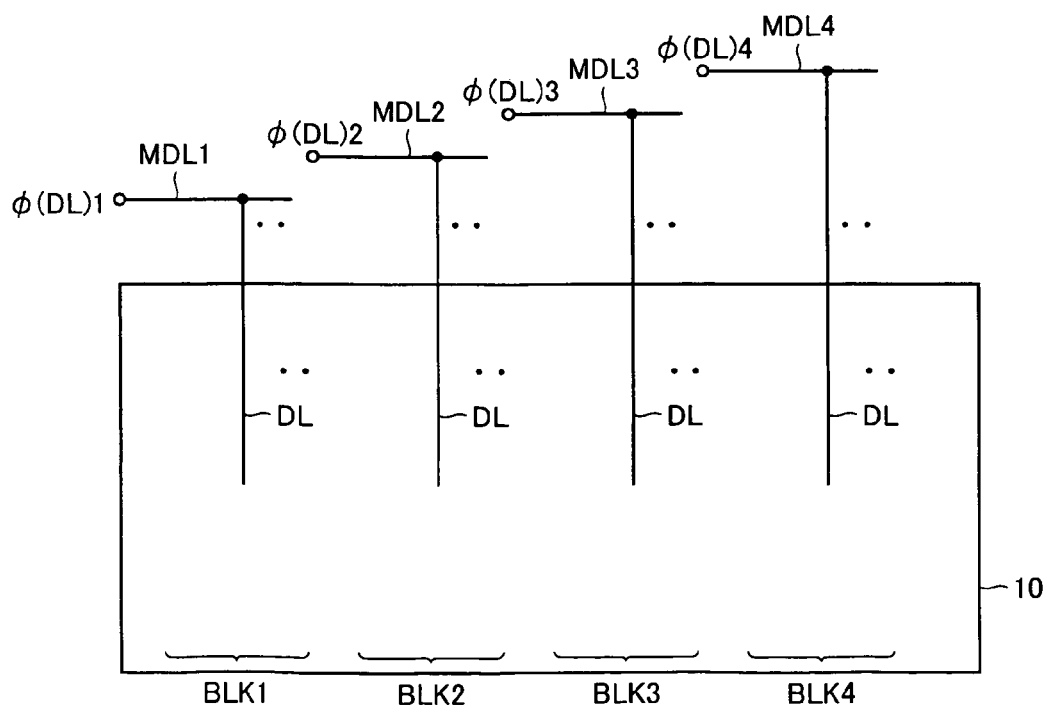
FIG. 24 illustrates an operation of the MRAM device according to the third variation of the second embodiment.
FIG. 25 is a conceptual view illustrating arrangement of a main digit line in a divided manner, applicable to the third variation of the second embodiment.

FIG. 24 illustrates an operation of the MRAM device according to the third variation of the second embodiment.

Clock cycles 1 to 9 in FIG. 24 is similar to the operation sequence in the MRAM device according to the second embodiment shown in FIG. 18. In addition, the voltage setting of write node 75, the setting of voltage signal φ(DL), and the on/off setting of switching elements S1, S3, S4a, and S4b during each of clock cycles 1 to 8 are the same as those in the operation sequence shown in FIG. 18. Therefore, detailed description thereof will not be repeated.

As described above, even if switching element S2 is not provided, selected digit line DLi can be charged to power supply voltage Vcc as in the data write operation in the MRAM device according to the second embodiment. Therefore, similar write operation can be performed.

In particular, in the configuration according to the third variation of the second embodiment, as a result of absence of switching element S2, the total sum of main digit line capacitance 61 and each digit line capacitance DL can integrally be used as the charge capacitance for supply of data write current Ip. Accordingly, the charge capacitance can further readily be ensured:

As described with reference to FIG. 10 as well, in the configuration without switching element S2, an amount of electric power supplied from the power supply is slightly larger than in the data write operation where the period for charging digit line DL is completely separated from the period for supplying data write current Ip. On the other hand, as it is not necessary to provide switching element S2 or as the charge capacitance of digit line DL can readily be ensured, increase in the circuit area due to arrangement of an additional capacitive element or a charge adjusting resistor can be avoided. That is, the present configuration is effective in reduction in the circuit area.

As shown in FIG. 25, in the configuration according to the third variation of the second embodiment as well, main digit line MDL may be arranged in a divided manner, in order to adjust main digit line capacitance 61.

Referring to FIG. 25, digit lines DL on memory cell array 10 may be divided into a plurality of blocks (for example, four blocks) BLK1 to BLK4 as in FIG. 22, and main digit lines MDL1 to MDL4 are arranged corresponding to blocks BLK1 to BLK4 respectively. The number of resultant sections of main digit line MDL may be determined as appropriate, such that a desired capacitance value of each divided main digit line is obtained as in the configuration shown in FIG. 22.

Here, it is preferable, from the viewpoint of ensuring the period for supplying electric power from the power supply, to independently set voltage signals φ(DL)1 to φ(DL)4 provided to main digit lines MDL1 to MDL4 respectively, to set corresponding voltage signal φ(DL)k (k: natural number) to the high impedance state in a block where there is no selected row, and to stop power supply from the power supply (battery).

Third Embodiment

Figure 26:
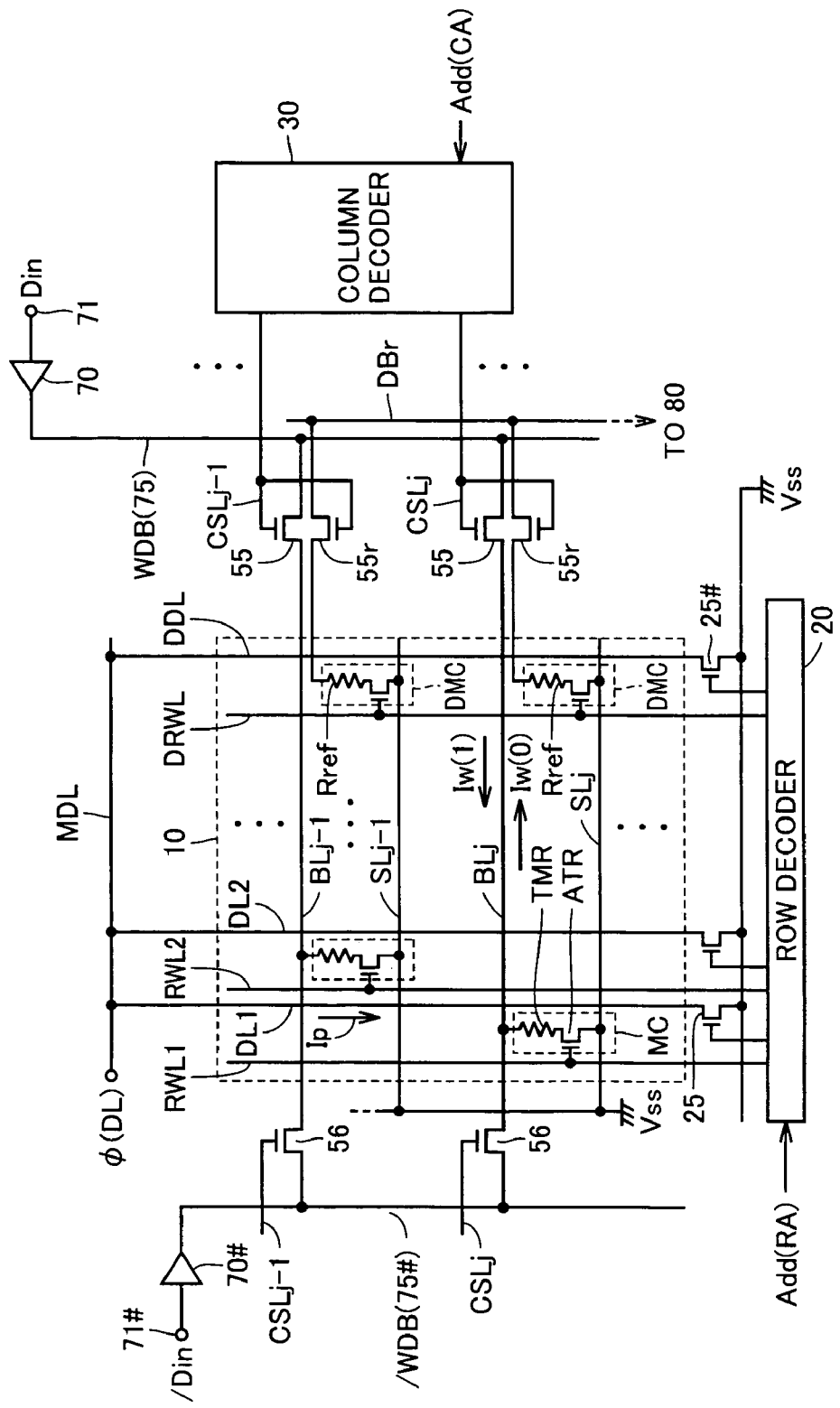
FIG. 26 is a schematic block diagram showing an overall configuration of an MRAM device according to a third embodiment of the present invention.

FIG. 26 is a schematic block diagram showing an overall configuration of an MRAM device 1c according to a third embodiment of the present invention.

Referring to FIG. 26, MRAM device 1c according to the third embodiment is different in part from MRAM device 1b according to the second embodiment shown in FIG. 16 in the configuration for supplying bit line BL with the data write current. Specifically, a data bus /WDB and a column selection switch 56 are newly provided, instead of write driver 50 provided corresponding to one end of each bit line BL.

Write data bus /WDB is driven to the data voltage in accordance with inverted data /Din of write data Din by a write buffer 70#. That is, write buffers 70 and 70# drive write data buses WDB and /WDB with voltages complementary to each other, in accordance with write data Din. Specifically, when Din="H level", write data bus WDB is driven to power supply voltage Vcc, while write data bus /WDB is driven to ground voltage Vss. In contrast, when Din="L level", write data bus WDB is driven to ground voltage Vss, while write data bus /WDB is driven to power supply voltage Vcc.

Write data bus /WDB is connected to corresponding bit line BL through column selection switch 56 in each memory cell column. Turn-on/off of column selection switch 56 is controlled in accordance with column selection line CSL common to column selection switch 55 in the same memory cell column. Therefore, in the selected column, both of column selection switches 55 and 56 are turned on, and selected bit line BLj is connected between write data buses WDB and /WDB. On the other hand, as both of column selection switches 55 and 56 are turned off in the non-selected column, bit line BL is disconnected from write data buses WDB and /WDB.

In addition, as in the third variation (FIG. 23) of the second embodiment, switching element S2 in each digit line DL is not provided, and each digit line DL is directly connected to main digit line MDL receiving voltage signal φ(DL).

As the configuration of MRAM device 1c according to the third embodiment is otherwise similar to that of MRAM device 1b according to the second embodiment, detailed description thereof will not be repeated. In addition, as in FIG. 16, FIG. 26 does not show a data-read-relevant circuit.

Figures 27, 28:
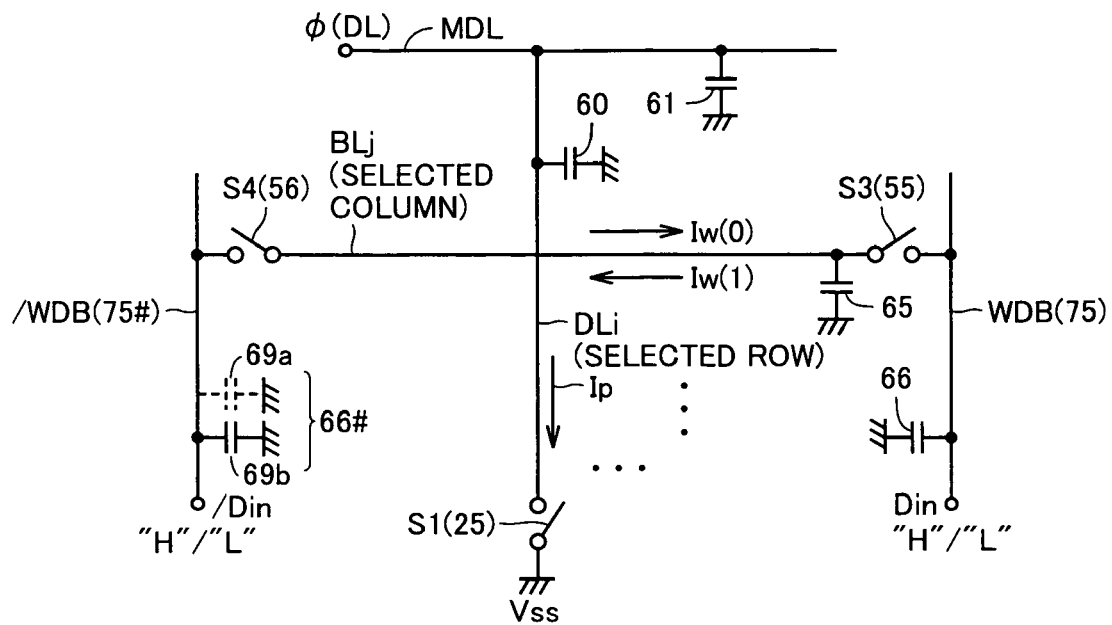
FIG. 27 is a conceptual view illustrating a data write current supply configuration according to the third embodiment of the present invention.
FIG. 28 illustrates an operation of the MRAM device according to the third embodiment.

FIG. 27 is a conceptual view illustrating a data write current supply configuration according to the third embodiment of the present invention.

Referring to FIG. 27, in the data write current supply configuration according to the third embodiment, each bit line BL is connected to write data bus WDB through switching element S3 (column selection switch 55), and connected to write data bus /WDB through switching element S4 (column selection switch 56).

Reference numeral 66# represents a charge capacitance of write data bus WDB. Write data bus capacitance 66# may be implemented by a parasitic capacitance 69a of write data bus WDB alone, or may be implemented by the sum of a capacitive element (additional capacitor) 69b connected to write data bus WDB and parasitic capacitance 69a.

As the configuration for supplying digit line DL with the data write current is similar to that according to the third variation of the second embodiment shown in FIG. 23, detailed description thereof will not be repeated.

FIG. 28 illustrates an operation of the MRAM device according to the third embodiment.

Referring to FIG. 28, in clock cycle 1, the stand-by operation (Stby) is performed. In the stand-by operation, in order to charge each digit line DL, voltage signal φ(DL) provided to main digit line MDL is set to power supply voltage Vcc. On the other hand, each of switching elements S1, S3, and S4 is turned off, so that the data write current does not flow on digit line DL and each bit line BL.

In clock cycle 2, the data read operation (Read) is performed. In data read as well, it is not necessary to feed the data write current to each bit line BL and each digit line DL. Therefore, the off state of switches S1, S3, and S4 is maintained, and the state of digit line DL charged to power supply voltage Vcc is maintained.

The stand-by operation in clock cycle 3 is similar to that in clock cycle 1.

In clock cycles 4 and 5, single data write (Write) is carried out. Initially, in clock cycle 4, write data buses WDB and /WDB corresponding to write nodes 75 and 76 respectively are charged to voltages in accordance with write data Din and inverted data /Din thereof respectively. For example, when Din="L level", capacitance 66 of write data bus WDB is charged to ground voltage Vss, while capacitance 66# of write data bus /WDB is charged to power supply voltage Vcc.

As the off state of switching elements S1, S3, and S4 is maintained also in clock cycle 4, the data write current is not produced in each digit line DL and each bit line BL. In other words, in this clock cycle, in succession to selected digit line DLi, write data buses WDB and /WDB, that is, write nodes 75 and 76 are charged to the data voltage levels in accordance with write data Din, respectively.

In next clock cycle 5, write nodes 75 and 76 as well as voltage signal φ(DL) are set to high impedance state (Z), and each of switching elements S1, S3, and S4 is turned on. As such, data write current Ip is produced on selected digit line DLi, and data write current Iw(0) is produced on selected bit line BLj.

When write data Din="H level", write data bus WDB is charged to power supply voltage Vcc and write data bus /WDB is charged to ground voltage Vss in clock cycle 4. Therefore, in clock cycle 5, in response to turn-on of switching elements S3 and S4, data write current Iw(1) can flow on selected bit line BLj.

In clock cycle 6, the stand-by operation similar to that in clock cycles 1 and 3 is performed again.

As described above, in the MRAM device according to the third embodiment, as in the first and second embodiments, the operation to charge digit line DL and write data buses WDB, /WDB (write nodes 75, 76) for supplying the data write current and the operation to actually supply data write currents Ip and Iw(0), Iw(1) can be performed independently, in a time-divided manner. Therefore, the load current supplied from the power supply (battery) to the MRAM device can have a gentle waveform, and the electric power supply period can be extended.

In addition, as the single data write operation can be performed in two clock cycles, the configuration according to the third embodiment is effective also in accelerating the data write operation.

In the description of the third embodiment, though the configuration for charging each digit line DL is similar to that in the MRAM device according to the third variation of the second embodiment, the configuration in which each digit line DL is charged through switching element S2 as in the first embodiment or the like may be employed. In this case, it is necessary to turn on switching element S2 at least in clock cycle 4 and to turn off the same in clock cycle 5 in the operation sequence shown in FIG. 25. Alternatively, as described in the second embodiment, the configuration in which main digit line MDL is divided for each block may be adopted.

Fourth Embodiment

A fourth embodiment will now be described, focusing on a configuration for supplying the data write current to bit line BL without providing write drivers 50 on opposing sides of bit line BL as described in the first embodiment or the like.

Figure 29:
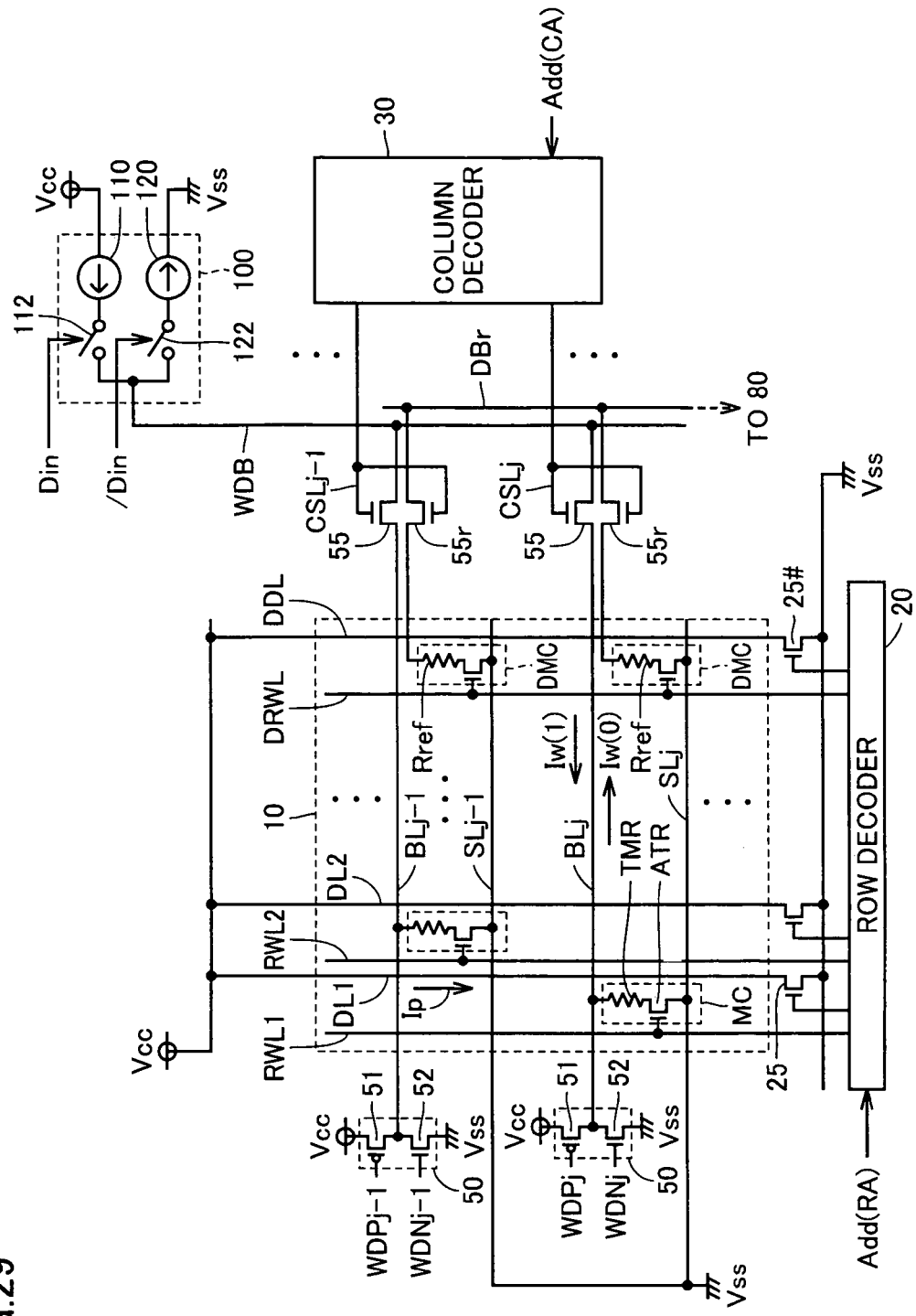
FIG. 29 is a schematic block diagram showing an overall configuration of an MRAM device according to a fourth embodiment of the present invention.

FIG. 29 is a schematic block diagram showing a data write configuration of an MRAM device 1d according to the fourth embodiment of the present invention.

Referring to FIG. 29, MRAM device 1d according to the fourth embodiment is different from MRAM device 1b (FIG. 16) according to the second embodiment in that a data write circuit 100 for supplying data write currents Iw(0), Iw(1) is provided, instead of write buffer 70 for voltage drive. In addition, as the configuration for charging each digit line DL to power supply voltage Vcc is not particularly limited, a most simplified configuration in which each digit line DL is directly connected to power supply voltage Vcc without a switching element being interposed is exemplarily shown.

Data write circuit 100 includes a constant current source 110 for supplying data write current Iw(1), a constant current source 120 for supplying data write current Iw(0), and switching elements 112, 122. Switching element 112 is provided between constant current source 110 and write data bus WDB. Switching element 122 is provided between constant current source 120 and write data bus WDB.

Switching element 112 is turned on when write data Din is at H level, and it is turned off when write data Din is at L level. In contrast, switching element 122 operates in response to inverted write data /Din. Specifically, switching element 122 is turned off when write data Din is at H level, and it is turned on when write data Din is at L level.

As the configuration and the operation of write driver 50 are similar to those in FIG. 1, detailed description thereof will not be repeated.

As in the second embodiment, one end side of each digit line DL is connected to ground voltage Vss through transistor switch 25 which is turned on/off depending of a result of row selection from row decoder 20. The other end side of each digit line DL is constantly connected to power supply voltage Vcc, without taking into account control during the period for charging.

Figures 30, 31:
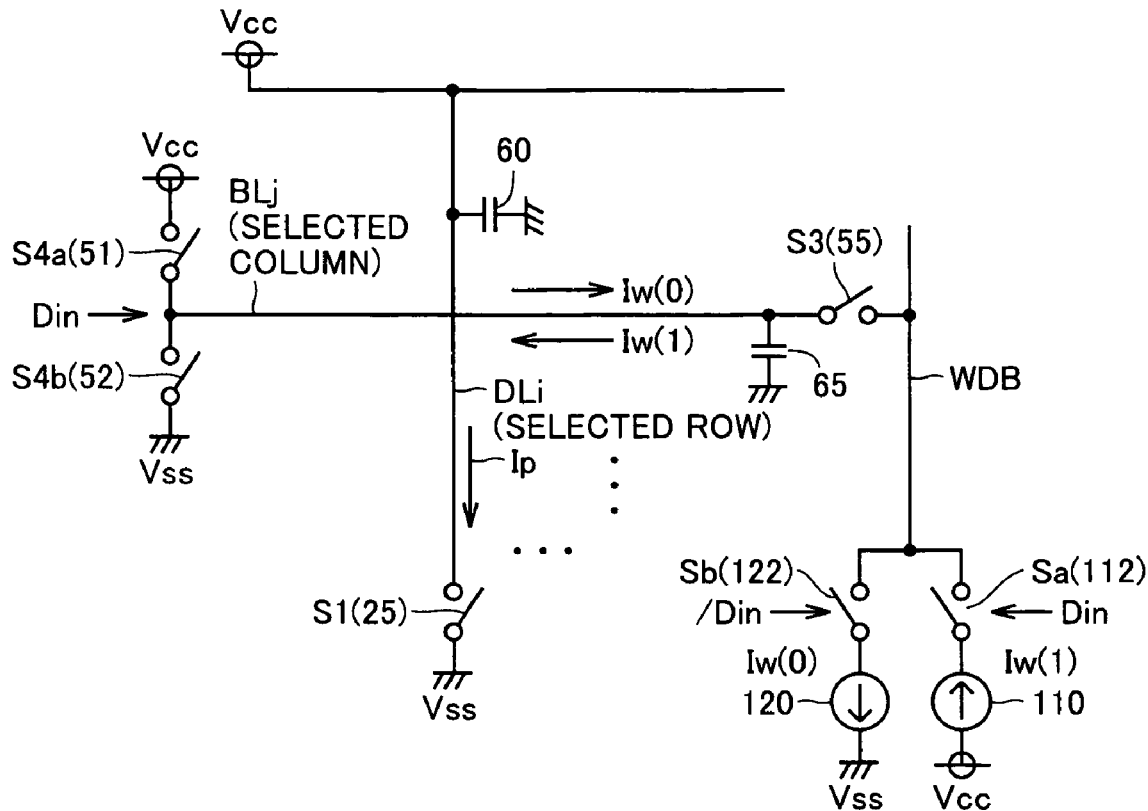
FIG. 30 is a conceptual view illustrating a data write current supply configuration according to the fourth embodiment of the present invention.
FIG. 31 illustrates a writing operation in the MRAM device according to the fourth embodiment.

FIG. 30 is a conceptual view illustrating a data write current supply configuration according to the fourth embodiment of the present invention.

Referring to FIG. 30, one end side of digit line DLi is connected to ground voltage Vss through switching element S1, so that data write current Ip can be fed to selected digit line DLi in response to turn-on of switching element S1.

One end side of selected bit line BLj is connected to write data bus WDB (write node 75) in response to turn-on of switching element S3 corresponding to column selection switch 55. Write data bus WDB is connected to either constant current source 110 or 120 through a switching element Sa (corresponding to switch 112 in FIG. 29) and a switching element Sb (corresponding to switch 122 in FIG. 29) that are selectively turned on in accordance with write data Din.

On the other hand, the other end side of selected bit line BLj is selectively connected to power supply voltage Vcc or ground voltage Vss in a manner complementary to the voltage set in write data bus WDB, through a switching element S4a (corresponding to transistor switch 51) and a switching element S4b (corresponding to transistor switch 52) that are selectively turned on in accordance with write data Din.

FIG. 31 illustrates a writing operation in the MRAM device according to the fourth embodiment.

In the MRAM device according to the fourth embodiment, charging and data current supply can simultaneously be performed, without particularly discriminating between the charge period for preparing for data write current supply and the data current supply period.

When write data Din="L level" (Write0), switching element S1 is turned on in order to feed selected digit line DLi with data write current Ip. In addition, switching elements S3, S4a, and Sb are turned on, while switching elements S4b and Sa are turned off.

As such, write data bus WDB (write node 75) is connected to constant current source 120 driven with ground voltage Vss. That is, write data bus WDB is set to ground voltage Vss, and connected to one end of selected bit line BLj through switching element S3. In addition, the other end of bit line BLj is connected to power supply voltage Vcc through switching element S4a. In this manner, data write current Iw(0) supplied from constant current source 120 flows on selected bit line BLj.

In contrast, when write data Din="H level" (Write 1), switching element S1 is turned on in order to feed selected digit line DLi with data write current Ip. In addition, switching elements S3, S4b, and Sa are turned on, while switching elements S4a and Sb are turned off.

As such, write data bus WDB (write node 75) is connected to constant current source 110 driven with power supply voltage Vcc. That is, write data bus WDB is set to power supply voltage Vcc, and connected to one end of selected bit line BLj through switching element S3. In addition, the other end of bit line BLj is connected to ground voltage Vss through switching element S4b. In this manner, data write current Iw(1) supplied from constant current source 110 is fed to selected bit line BLj.

According to this configuration, the number of write drivers 50 to be arranged can be reduced and the circuit area is made smaller, as compared with the configuration in which write drivers 50 are arranged on opposing sides of each bit line BL.

In the configuration as in the third embodiment where both of complementary write data buses WDB and /WDB are provided on opposing sides of each bit line BL respectively, the path for data write current tends to be longer, although write driver 50 may not be provided. In such a case, a parasitic resistance is increased, which could make it difficult to ensure the data write current.

Here, as in the MRAM device according to the fourth embodiment, the write driver including a plurality of switching elements and write data bus WDB set to the data voltage in accordance with the write data are arranged on opposing sides of bit line BL, respectively. Therefore, reduction in the circuit area and ensured supply of data write current by avoiding the increased length of the path for the data write current can both be achieved.

Variation of Fourth Embodiment

Figure 32:
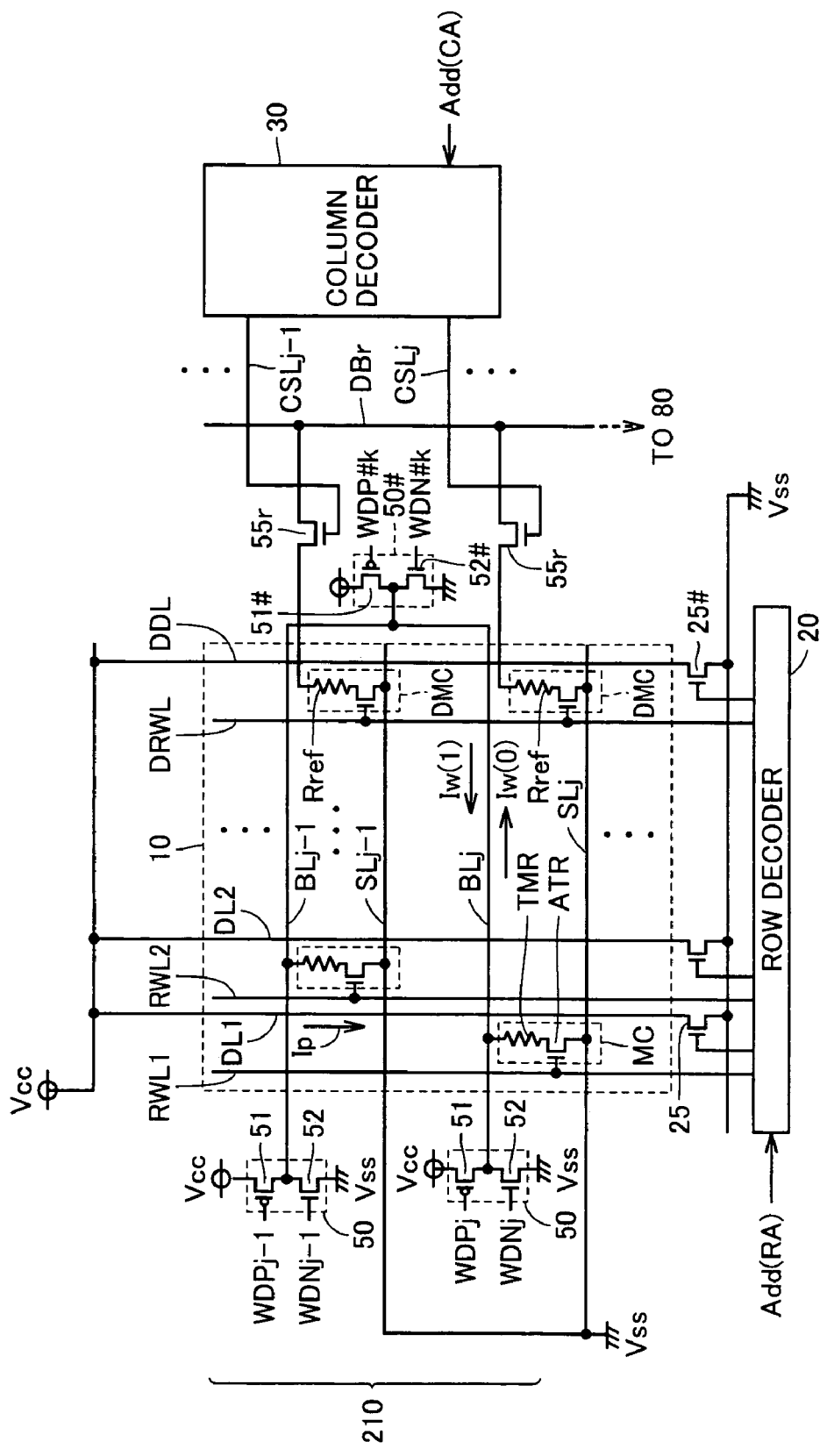
FIG. 32 is a schematic block diagram showing an overall configuration of an MRAM device according to a variation of the fourth embodiment of the present invention.

FIG. 32 is a schematic block diagram showing a data write configuration of an MRAM device 1e according to a variation of the fourth embodiment.

Referring to FIG. 32, MRAM device 1e according to the variation of the fourth embodiment is different from MRAM device 1b (FIG. 16) according to the second embodiment in that a write driver 50# shared by a plurality of bit lines is provided, instead of write buffer 70 for voltage drive.

Specifically, in MRAM device 1e, all bit lines in memory cell array 10 are divided into bit line groups 210, each consisting of a plurality of bit lines. In the configuration example of FIG. 32, each bit line group 210 consists of two bit lines (bit lines BLj-1 and BLj in FIG. 32).

One end side of bit line BL is connected to write driver 50# provided for each bit line group 210. That is, write driver 50# is shared by a plurality of bit lines belonging to identical bit line group 210.

Write driver 50# is configured in a manner similar to write driver 50, and it includes transistor switches 51# and 52#. For example, transistor switch 51# is implemented by a pMOS transistor, while transistor switch 52# is implemented by an NMOS transistor.

The gate of transistor switch 51# receives a control signal WDP#, while the gate of transistor switch 52# receives a control signal WDN#. Control signals WDP#, WDN# are generated independently of each bit line group 210. FIG. 32 illustrates control signals WDP#k, WDN#k, corresponding to kth (k: natural number) bit line group.

The other end side of bit line BL is connected to write driver 50 provided corresponding to each bit line BL. As the configuration and the operation of write driver 50 are similar to those in FIG. 1, detailed description thereof will not be repeated.

In addition, as the configuration for charging each digit line DL to power supply voltage Vcc is not particularly limited as in MRAM device 1d shown in FIG. 29, a most simplified configuration in which each digit line DL is directly connected to power supply voltage Vcc without a switching element being interposed is exemplarily shown.

As in the second embodiment, one end side of each digit line DL is connected to ground voltage Vss through transistor switch 25 which is turned on/off depending of a result of row selection from row decoder 20. The other end side of each digit line DL is constantly connected to power supply voltage Vcc, without taking into account control during the charge period.

Figures 33, 34:
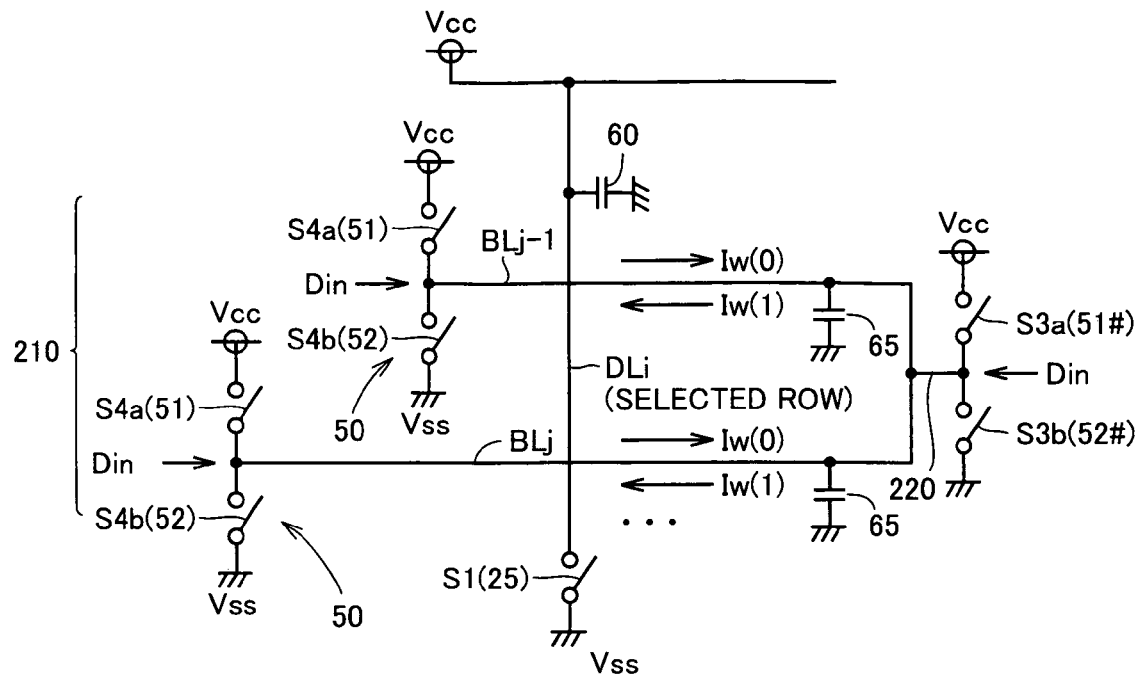
FIG. 33 is a conceptual view illustrating a data write current supply configuration according to the variation of the fourth embodiment of the present invention.
FIG. 34 illustrates a writing operation in the MRAM device according to the variation of the fourth embodiment.

FIG. 33 is a conceptual view illustrating a data write current supply configuration according to the variation of the fourth embodiment of the present invention.

Referring to FIG. 33, one end side of digit line DLi is connected to ground voltage Vss through switching element S1, so that data write current Ip can be fed to selected digit line DLi in response to turn-on of switching element S1.

One end sides of bit lines BLj and BLj-1 belonging to identical bit line group 210 are connected to each other at a node 220. Node 220 is connected to power supply voltage Vcc through a switching element S3a, as well as to ground voltage Vss through a switching element S3b. Switching elements S3a and S3b correspond to transistor switches 51# and 52# (FIG. 32) constituting write driver 50#, respectively.

Meanwhile, the other end sides of bit lines BLj and BLj-1 are connected to power supply voltage Vcc and ground voltage Vss, through switching elements S3a and S3b provided corresponding to each bit line BL respectively.

FIG. 34 illustrates a writing operation in the MRAM according to the variation of the fourth embodiment.

In the MRAM device according to the variation of the fourth embodiment as well, charging and data current supply can simultaneously be performed, without particularly discriminating between the charge period for preparing for data write current supply and the data current supply period, as in the MRAM device according to the fourth embodiment.

In the bit line group in which all corresponding bit lines are in the non-selected state, switching elements S3a, S3b are both turned off. Similarly, in the non-selected bit line, switching elements S4a, S4b are both turned off. In addition, switching element S1 corresponding to the non-selected digit line is also turned off.

In contrast, one of switching elements S4a, S4b corresponding to the bit line group including the selected bit line is turned on and the other one of the same is turned off in accordance with the write data. In addition, one of switching elements S3a, S3b corresponding to the selected bit line is turned on and the other one of the same is turned off in accordance with the write data, such that the other end side of the selected bit line is selectively connected to power supply voltage Vcc or ground voltage Vss in a manner complementary to the voltage set at node 220.

Specifically, when write data Din="L level" (Write0), switching element S1 is turned on in order to feed selected digit line DLi with data write current Ip. In addition, switching elements S4a, S3b are turned on, while switching elements S4b, S3a are turned off.

In this manner, node 220 is set to ground voltage Vss by switching element S3b. Meanwhile, the other end of the selected bit line is connected to power supply voltage Vcc by switching element S4a. As such, data write current Iw(0) is fed to the selected bit line, and data "0" is written in the selected memory cell.

In contrast, when write data Din="H level" (Write 1), switching element S1 is turned on in order to feed selected digit line DLi with data write current Ip. In addition, switching elements S4b, S3a are turned on, while switching elements S4a, S3b are turned off.

In this manner, node 220 is set to power supply voltage Vcc by switching element S3a. Meanwhile, the other end of the selected bit line is connected to ground voltage Vss by switching element S4b. As such, data write current Iw(1) is fed to the selected bit line, and data "1" is written in the selected memory cell.

According to such a configuration, ensured supply of data write current can more readily be obtained, without causing increased length of the path for the data write current due to arrangement of the write data bus. In addition, the number of write drivers 50 to be arranged can be reduced and the circuit area can be made smaller, as compared with the configuration in which write drivers 50 are arranged on opposing sides of each bit line BL.

Though FIGS. 32 to 34 show such a configuration that each bit line group 210 includes two bit lines, each bit line group may include any plurality of bit lines.

Fifth Embodiment

Figure 35:
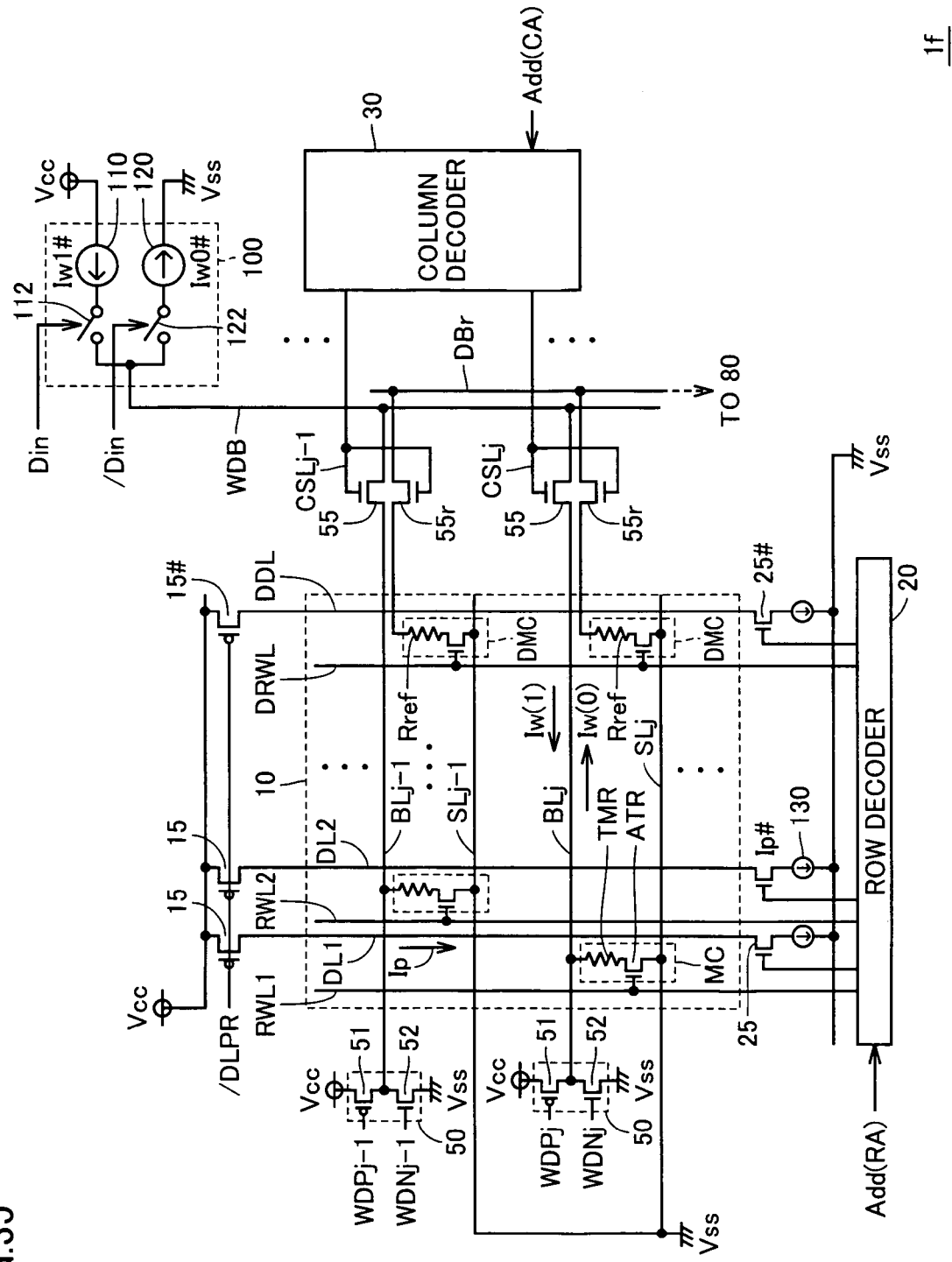
FIG. 35 is a schematic block diagram showing an overall configuration of an MRAM device according to a fifth embodiment of the present invention.

FIG. 35 is a schematic block diagram showing an overall configuration of an MRAM device If according to a fifth embodiment.

Referring to FIG. 35, MRAM device If according to the fifth embodiment is different from MRAM device 1a according to the first embodiment in that a constant current source 130 provided for each digit line DL and data write circuit 100 provided instead of write buffer 70 are further included. Data write circuit 100 is configured in a manner the same as shown in FIG. 29, and constant current sources 110 and 120 supply constant currents Iw0#, Iw1# that are part of necessary data write currents Iw(0) and Iw(1) respectively.

Constant current source 130 can feed corresponding digit line DL with a constant current Ip# when corresponding transistor switch 25 is turned on. Constant current Ip# corresponds to a part of necessary data write current Ip.

Figure 36:
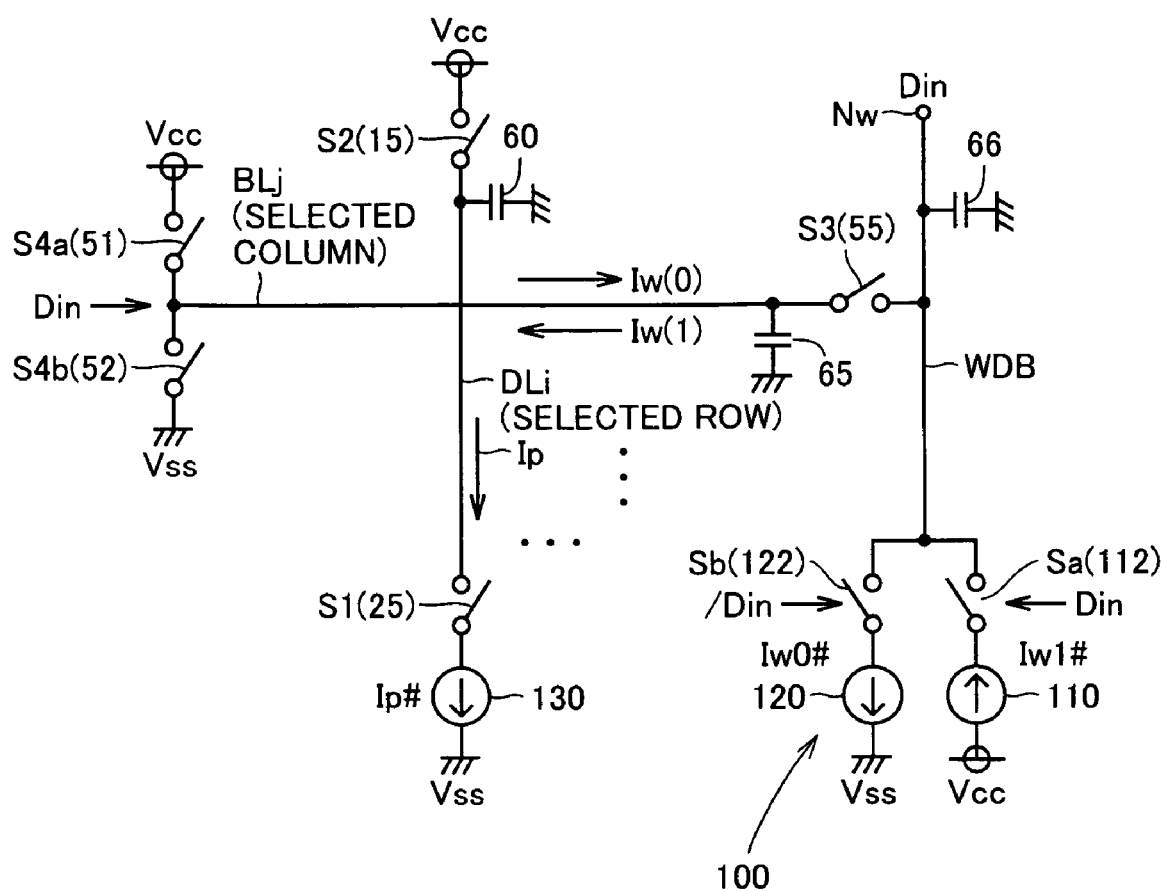
FIG. 36 is a conceptual view illustrating a data write current supply configuration according to the fifth embodiment of the present invention.

FIG. 36 is a conceptual view illustrating a data write current supply configuration according to the fifth embodiment of the present invention.

Referring to FIG. 36, the data write current supply configuration according to the fifth embodiment is different from the data write current supply configuration according to the first embodiment shown in FIG. 4 in that constant current source 130 is arranged on a path for supplying data write current Ip, that is, between switching element S1 (transistor switch 25) and ground voltage Vss and that constant current sources 110 and 120 are selectively connected to write data bus WDB corresponding to write node 75 in accordance with write data Din, as in the configuration shown in FIG. 30. As the data write current supply configuration according to the fifth embodiment is otherwise similar to that according to the first embodiment shown in FIG. 4, detailed description thereof will not be repeated.

FIG. 37 illustrates an operation of the MRAM device according to the fifth embodiment.

In clock cycles 1 to 9 shown in FIG. 37, an operation similar to that in clock cycles 1 to 9 shown in FIG. 6 is performed. Accordingly, the operation of switching elements S1, S4a, and S4b is as shown in FIG. 6. In addition, during the stand-by operation (Stby) and the data read operation (Read), that is, during clock cycles 1 to 3 and 9, switching elements S2 in both of the selected row and the non-selected row are turned on.

Clock cycles 4 to 8 constitute a single data write operation. In the single data write operation, either "Write0" for writing data "0" (Din="L level") or "Write1" for writing data "1" (Din="H level") is executed. In the example shown in FIG. 37, it is assumed that "Write0" is executed during clock cycles 4 to 8.

On the other hand, during the data write operation (clock cycle 4 to 8), the off state of switching element S2 in the non-selected row is maintained, while switching element S2 in the selected row is turned on except for during clock cycle 6 in which the selected bit line is re-charged to the data voltage in accordance with the write data.

In addition, switching elements Sa and Sb within data write circuit 100 are turned off except for during the data write operation, while one of the switching elements selected in accordance with data write Din is turned on in a manner paired with switching element S1 during the data write operation (clock cycles 4 to 8). That is, during the operation for writing data "0" (Write0), switching element Sa is turned off throughout clock cycles 4 to 8, while switching element Sb is turned on during clock cycles 5 and 8. Though not shown, during the operation for writing data "1" (Write1), switching element Sb is turned off throughout clock cycles 4 to 8, while switching element Sa is turned on during clock cycles 5 and 8.

Moreover, the on state of switching element S3 is maintained during the data write operation (clock cycles 4 to 8) in order to connect constant current sources 110, 120 to selected bit line BLj.

In this manner, for example in clock cycle 4, digit line capacitance 60 as well as bit line capacitance 65 and write data bus capacitance 66 are charged as in the first embodiment, and in clock cycle 5, data write current Ip including the discharge current from digit line capacitance 60 and constant current Ip# from constant current source 130 is fed to selected digit line DLi. Similarly, data write current Iw(0) including the charge/discharge current from bit line capacitance 65 and write data bus capacitance 66 and constant current Iw0# from constant current source 120 is supplied to selected bit line BLj. Data "0" is thus written in the selected memory cell.

In clock cycle 6, the selected bit line is re-charged to the data voltage (ground voltage Vss) in accordance with the write data, as in clock cycle 6 shown in FIG. 6.

In succeeding clock cycle 7, switching element S2 in the selected row is turned on, and the digit line capacitance in the selected digit line is re-charged to power supply voltage Vcc. Here, as switching element S1 has been turned off, data write current Ip does not flow. In addition, as switching elements S4a, S4b are turned off, selected bit line BLj is maintained to the state the same as that at the time of end of clock cycle 6.

In clock cycle 8, switching elements S1 and S4a are turned on, as in clock cycle 9 shown in FIG. 6. Therefore, though data write current Ip flows on selected digit line, the data write current does not flow on selected bit line BLj, because selected bit line BLj has its opposing ends connected to power supply voltage Vcc.

In this manner, in the single data write operation constituted of clock cycles 4 to 8, writing of data "0" (Din="L level") is carried out as result of data write current supply in clock cycle 5.

In clock cycle 9, the stand-by operation (Stby) similar to that in clock cycles 1, 3, and 8 is performed.

It is noted that the data write operation of "Write1" is performed by changing the voltage setting at write node 75 in clock cycles 4 and 6 to the data voltage (power supply voltage Vcc) in accordance with Din="H level", by switching on/off switching elements S1 to S3, S4a, and S4b as in "Write0", and by interchanging the on/off state of switching elements Sa and Sb in clock cycles 5 and 8. Accordingly, in "Write1", the data write current is not produced on selected bit line BLj in clock cycle 5, while data write current Iw(1) flows on selected bit line BLj in clock cycle 8. Data "1" is thus written in the selected memory cell.

As described above, in the MRAM device according to the fifth embodiment, data write currents Ip and Iw(0), Iw(1) based on the sum of the discharge current by means of the charges stored in digit line DL and bit line BL described in the first embodiment and the constant current from constant current sources 110, 120, and 130 are supplied.

Therefore, constant currents Iw1#, Iw0#, and Ip# supplied from constant current sources 110, 120, and 130 should be designed to cover any shortfall, considering a relation between the current that can be supplied based on the product of digit line capacitance 60, bit line capacitance 65 and the voltage for charging the same (corresponding to the voltage difference between power supply voltage Vcc and ground voltage Vss), that is, based on the stored charges, and the product of an amount of necessary data write current and an application time period.

According to such a configuration, ensured supply of data write current can readily be obtained, without causing increase in the circuit area due to arrangement of an additional capacitor for digit line capacitance 60 or bit line capacitance 65. In particular, as data write current supply is facilitated, power supply voltage Vcc can be lowered. In addition, as the transistor implementing constant current sources 110, 120, and 130 can be reduced in size by supplying a part of the data write current by means of discharge of the stored charges, the circuit area can also be reduced.

MRAM device 1e according to the fifth embodiment has a configuration obtained by additionally arranging constant current sources 110, 120, and 130 in the configuration of MRAM device 1a according to the first embodiment. Similarly, such a configuration that the data write current based on the sum of discharge of the stored charges and the constant current supplied from the constant current source is supplied by additionally arranging a constant current source in the variation of the first embodiment, the second embodiment, and the variation of the second embodiment may be employed.

Figure 38:
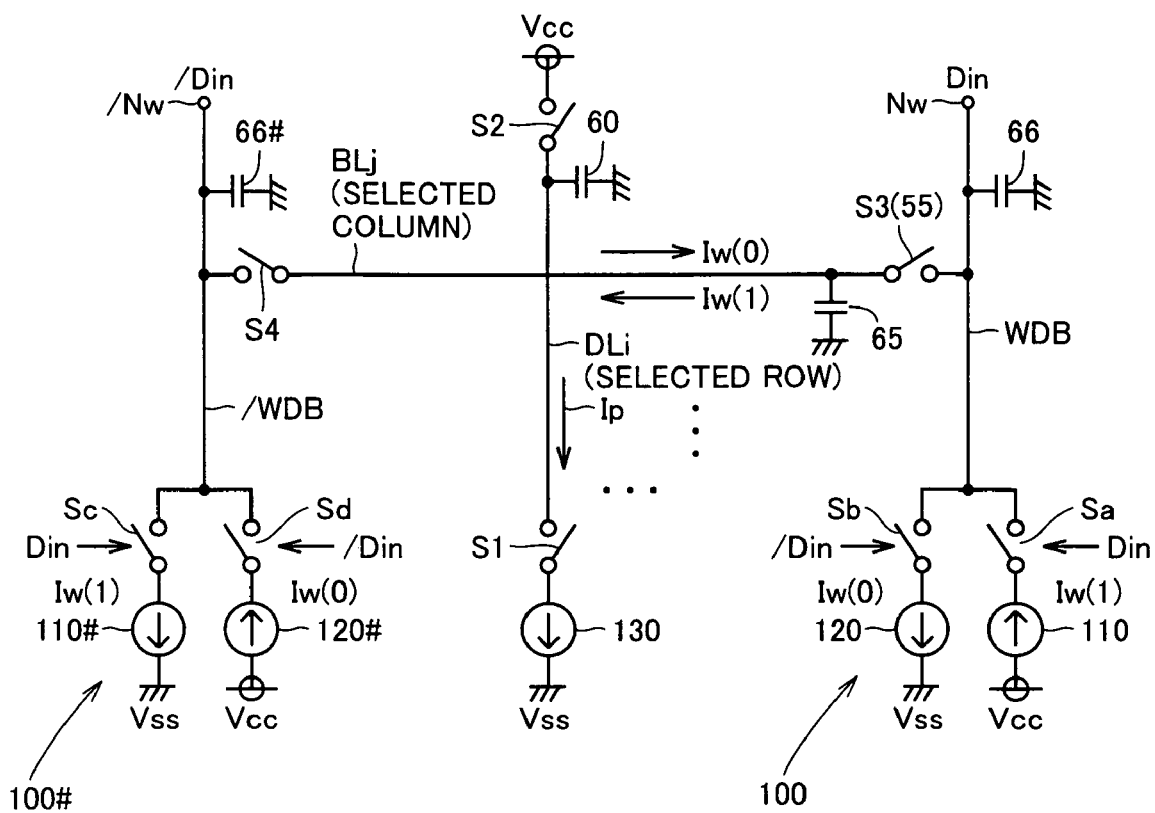
FIG. 38 is a conceptual view illustrating another data write current supply configuration according to the fifth embodiment of the present invention.

For example, FIG. 38 shows a configuration in which constant current sources for supplementing data write current supply to write data buses WDB and /WDB respectively are provided in the MRAM device according to the third embodiment.

Referring to FIG. 38, data write circuit 100 is provided for data bus WDB, as in FIG. 36. That is, data bus WDB is connected to constant current sources 110 and 120 through switching elements Sa and Sb. Similarly, a data write circuit 100# is provided for data bus /WDB. Data write circuit 100# includes constant current sources 110# and 120# and switching elements Sc and Sd. As such, data bus /WDB is connected to constant current sources 110# and 120# through switching elements Sc and Sd. Turn-on/off of switching element Sc is controlled in accordance with write data Din as in switching element Sa, while turn-on/off of switching element Sd is controlled in accordance with inverted write data /Din as in switching element Sb In such a configuration, as shown in FIG. 39, turn-on/off of switching elements S1, S3, and S4 is set in a manner the same as in the third embodiment (FIG. 28). In addition, switching element S2 is set such that it is turned on in the selected row and turned off in the non-selected row during the data write operation, as in FIG. 37. Moreover, switching elements Sa to Sd provided corresponding to constant current sources 110, 120, 110#, and 120# respectively are controlled such that they are selectively turned on in accordance with write data Din during each data write operation period simultaneously with switching elements S3 and S4.

According to such a configuration, increase in the circuit area due to arrangement of an additional capacitor for digit line capacitance 60 or bit line capacitance 65 can be avoided, and the constant current supplied by constant current sources 110, 110#, 120, 120#, and 130 can be suppressed. Therefore, an effect attained by the MRAM device according to the fifth embodiment can similarly be achieved.

In the embodiments above, though power supply voltage Vcc common to both of a data-write-relevant component and a data-read-relevant component has been employed, power supply voltages different between data read and data write may be used. In addition, power supply voltage Vcc may directly be supplied from an external power supply (for example, battery), or alternatively, a power supply voltage for data read and data write may be generated by a voltage down converter (VDC) (for example, VDC having a common and general configuration using a differential amplifier) or a booster circuit (for example, a charge pump circuit having a common and general configuration).

In particular, if a charge pump circuit is adopted, a power supply voltage for producing a data write current can internally be generated by utilizing a period except for a period for the data write operation, in an IC card application where it is difficult to supply a large current from a power supply terminal at one time. Therefore, ensured supply of data write current is facilitated.

In addition, the data write current fed to digit line DL and bit line BL provided as the "write current line" should be set within a range from a current lower limit necessary for carrying out data write into the selected memory cell to a current upper limit preventing improper writing into non-selected memory cells in the vicinity. In particular, as the peak value of the data write current is raised due to a parasitic resistance or a parasitic capacitance on a circuit, control thereof is difficult. Accordingly, by applying to digit line DL and bit line BL, a metal wire of which three sides are covered with a thin ferromagnetic material as disclosed in "A 1-Mbit MRAM Based on 1T1MTJ Bit Cell Integrated With Copper Interconnects" by Mark Durlam et al., leakage of magnetic field into the non-selected memory cells is suppressed, and occurrence of improper data write can be suppressed.

In the first to fifth embodiments and variations thereof described above, a single-bit data write configuration, that is, the configuration in which the data write current in accordance with the write data is fed to a single selected bit line, has been discussed. A similar configuration, however, may be extended to a multiple-bit parallel data write configuration.

Figure 40:
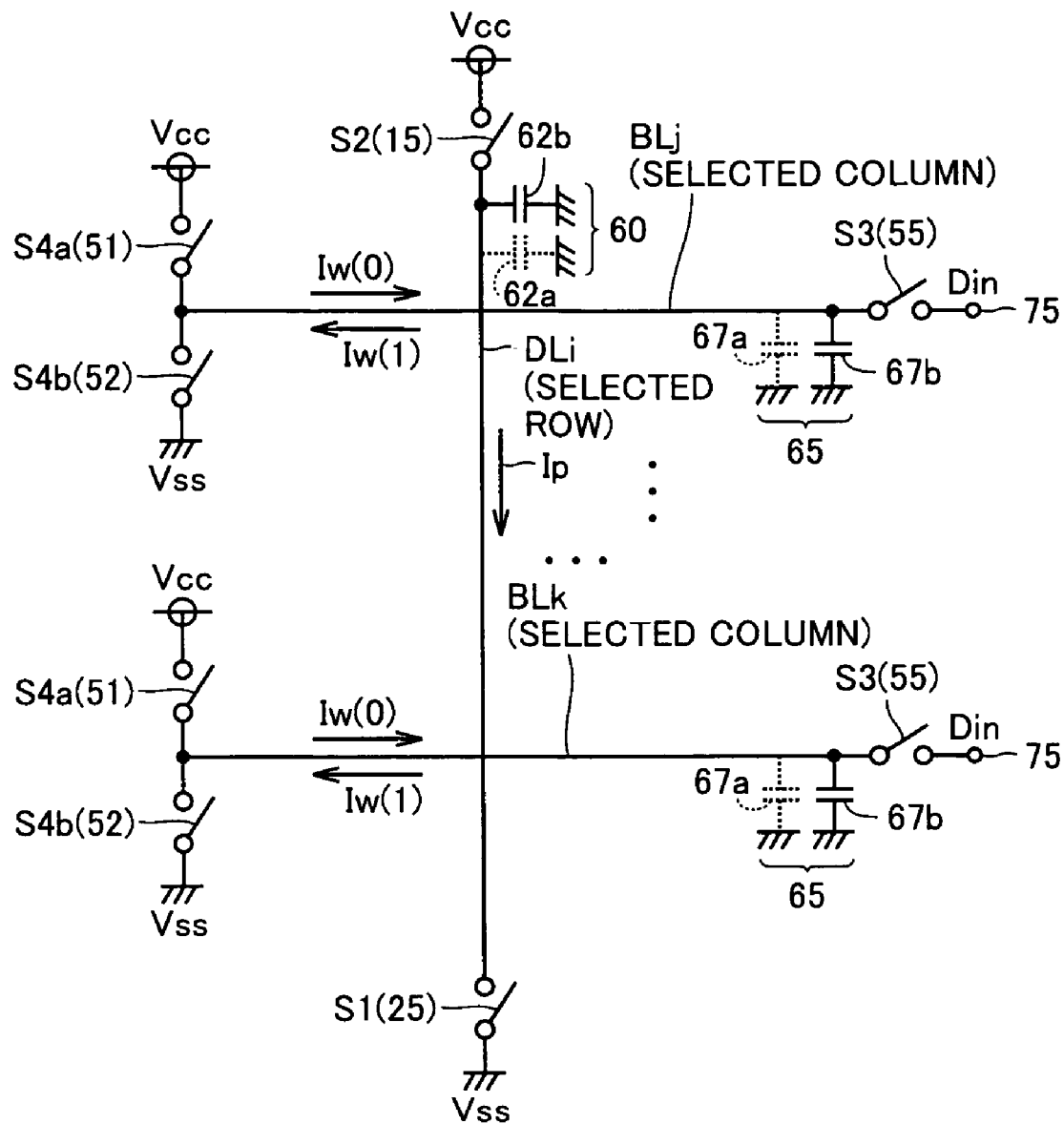
FIG. 40 is a conceptual view illustrating a data write current supply configuration according to the first embodiment, extended to multiple-bit writing.

FIG. 40 is a conceptual view illustrating an example in which a data write current supply configuration according to the first embodiment shown in FIG. 4 is extended to multiple-bit writing.

Referring to FIG. 40, in the data write current supply configuration according to the first embodiment, a plurality of write nodes 75 in the number corresponding to the number of bits written in parallel are provided, whereby multiple-bit parallel data write can be realized.

For example, independent write nodes 75 corresponding to two selected bit lines BLj and BLk respectively are provided, and switching elements S3, S4a, and S4b corresponding to selected bit lines BLj and BLk are operated in parallel in a similar sequence, as shown in FIG. 41. In this manner, independent write data can be written in parallel to selected bit lines BLj and BLk respectively.

Figure 42:
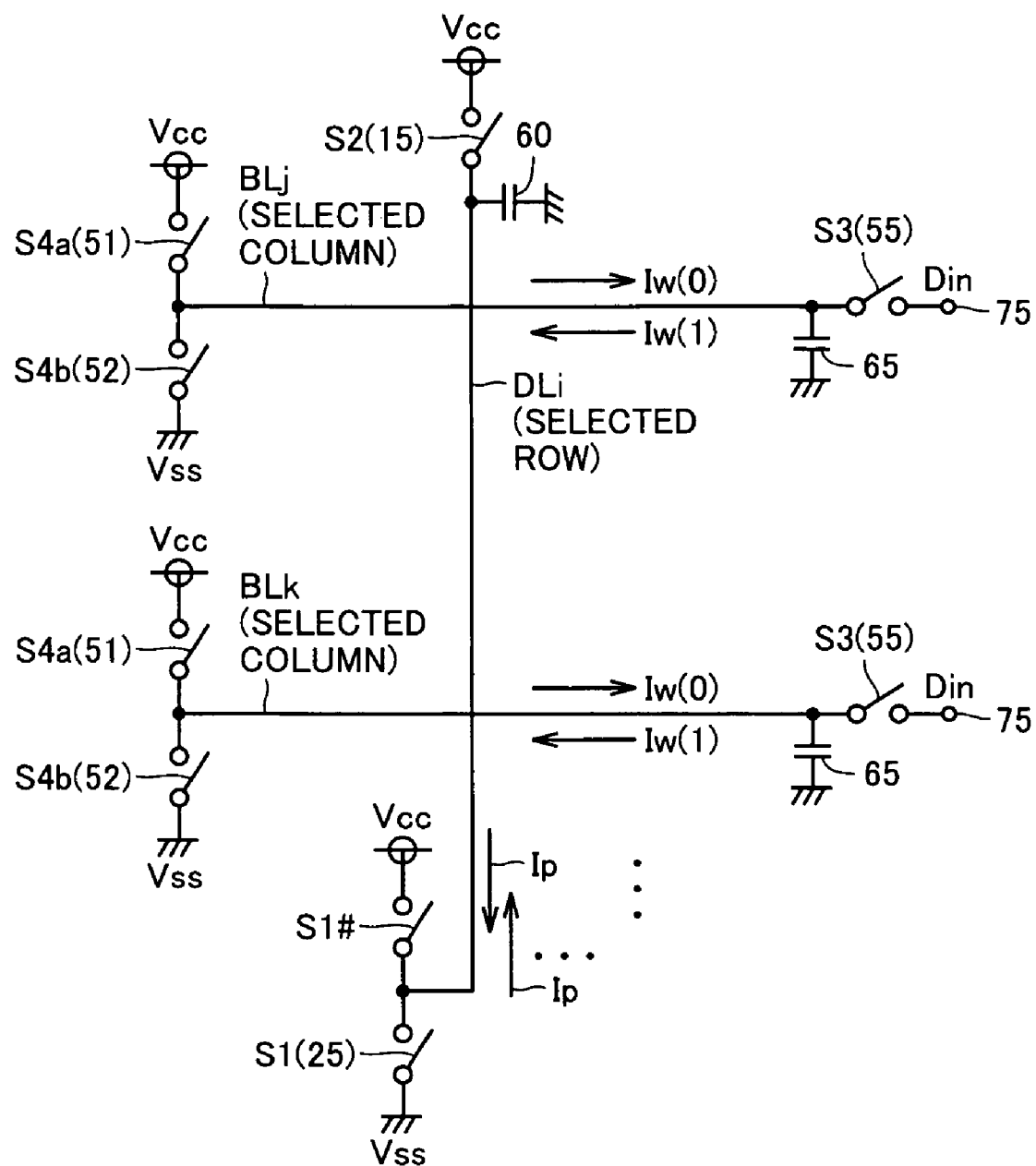
FIG. 42 is a conceptual view illustrating the data write current supply configuration according to the second variation of the first embodiment, extended to multiple-bit writing.

As shown in FIG. 42, in the data write current supply configuration according to the second variation of the first embodiment shown in FIG. 14 as well, a plurality of write nodes 75 in the number corresponding to the number of bits written in parallel are provided, whereby multiple-bit parallel data write in a similar manner can be realized. In this case as well, switching elements S3, S4a, and S4b in the selected bit line corresponding to each write node are operated in parallel in a similar sequence. Though not shown, in the data write current supply configuration according to the first variation of the first embodiment as well as the second embodiment and its variation, a plurality of write nodes 75 in the number corresponding to the number of bits written in parallel are provided, whereby multiple-bit parallel data write in a similar manner can be realized.

Figure 43:
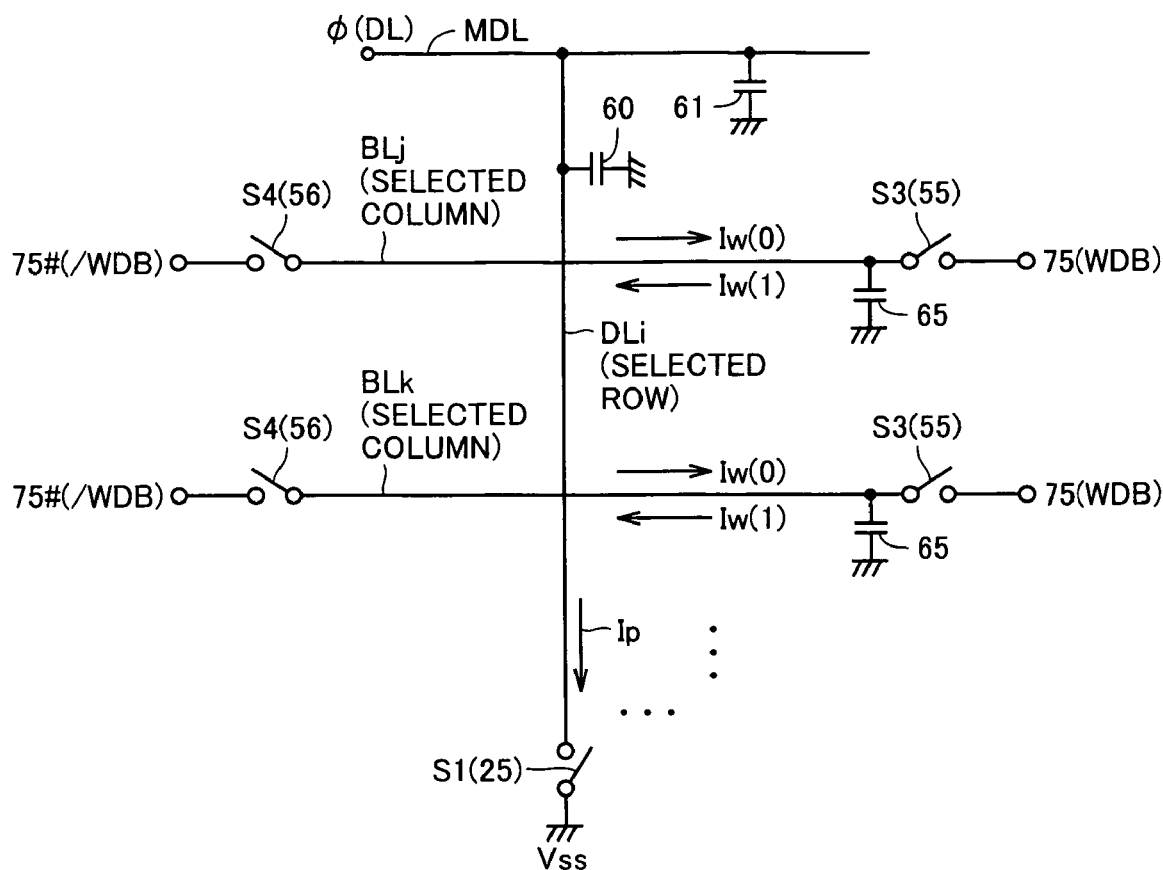
FIG. 43 is a conceptual view illustrating the data write current supply configuration according to the third embodiment of the present invention, extended to multiple-bit writing.

As shown in FIG. 43, in the data write current supply configuration according to the third embodiment shown in FIG. 27, a plurality of sets of write data buses WDB, /WDB corresponding to the write node are provided, the number of sets being corresponding to the number of bits written in parallel, whereby multiple-bit parallel data write in a similar manner can be realized. In this case as well, switching elements S3 and S4 in the selected bit line corresponding to each write node should be operated in parallel in a similar sequence.

Figure 44:
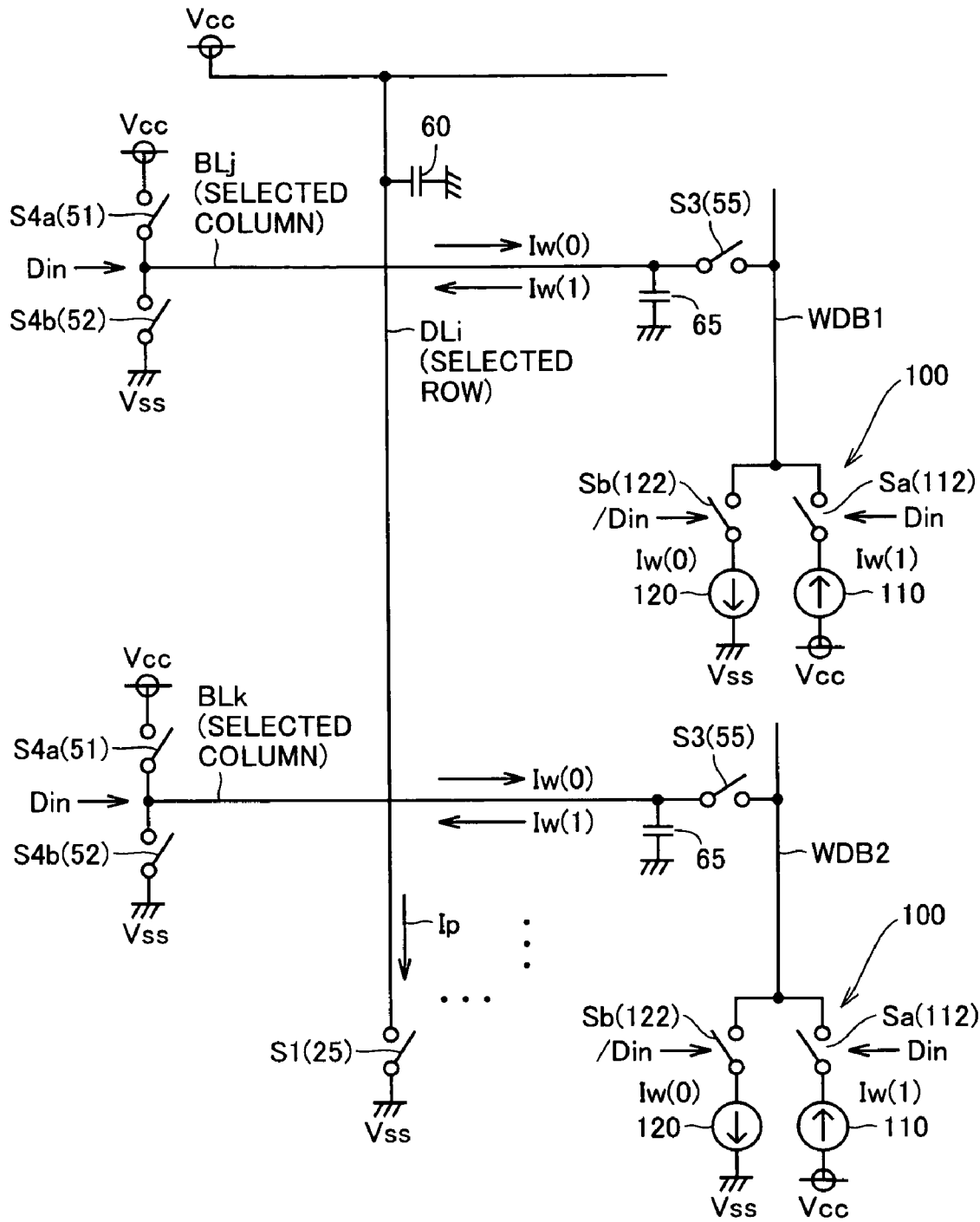
FIG. 44 is a conceptual view illustrating the data write current supply configuration according to the fourth embodiment of the present invention, extended to multiple-bit writing.

As shown in FIG. 44, in the data write current supply configuration according to the fourth embodiment shown in FIG. 30, a plurality of sets of write data bus WDB and data write circuit 100 are provided, the number of sets being corresponding to the number of bits written in parallel, whereby multiple-bit parallel data write in a similar manner can be realized. In this case as well, switching elements S3, S4a, and S4b in the selected bit line corresponding to each write node should be operated in parallel in a similar sequence.

Figure 45:
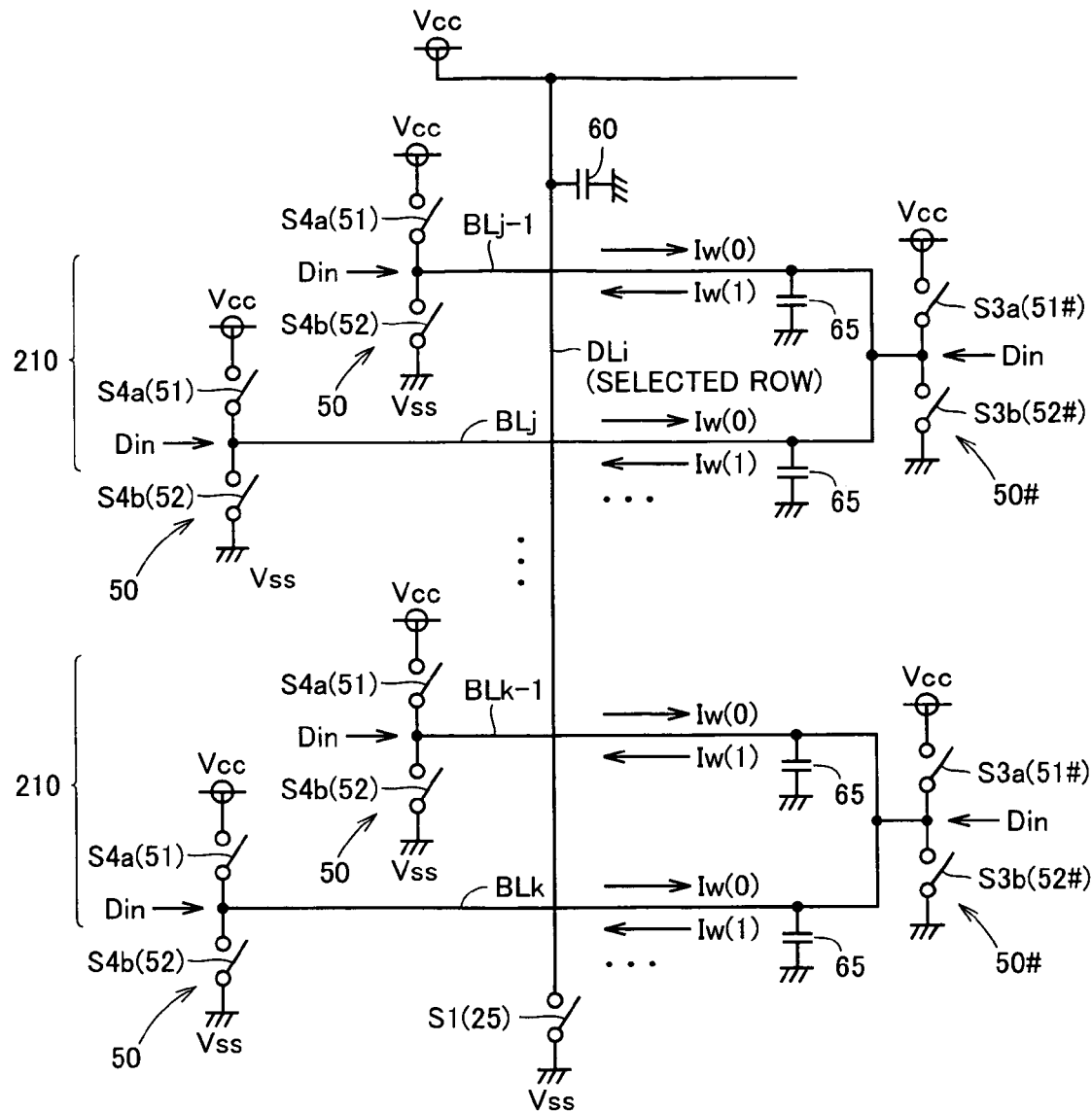
FIG. 45 is a conceptual view illustrating the data write current supply configuration according to the variation of the fourth embodiment of the present invention, extended to multiple-bit writing.

As shown in FIG. 45, in the data write current supply configuration according to the variation of the fourth embodiment shown in FIG. 33, a signal for on/off control of switching elements S3a, S3b, S4a, and S4b should be generated such that write drivers 50 and 50# connect the selected bit line to the data voltage (Vcc or Vss) in a plurality of bit line groups 210, the number of bit line groups being corresponding to the number of bits written in parallel.

Figure 46:
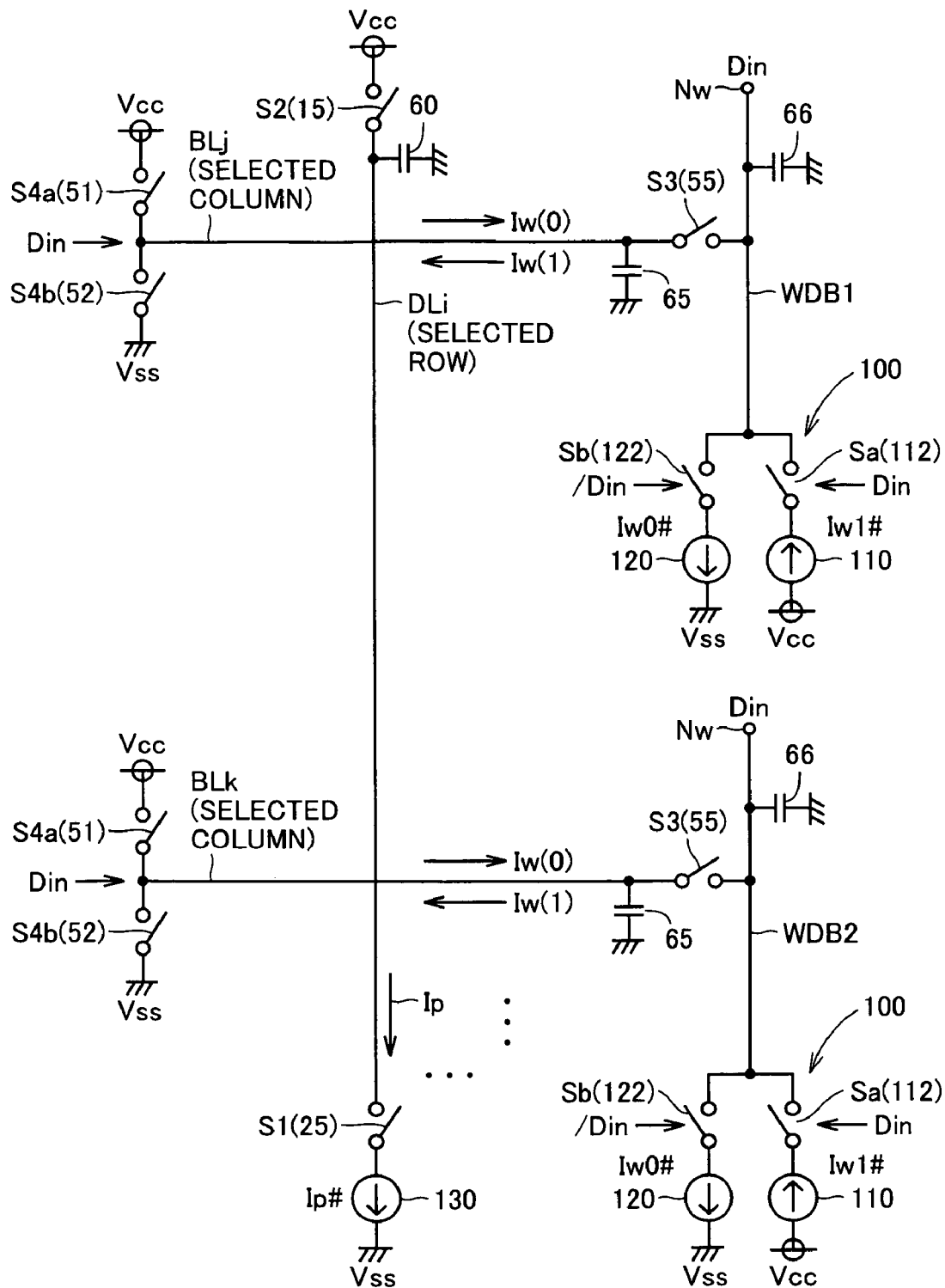
FIG. 46 is a conceptual view illustrating the data write current supply configuration according to the fifth embodiment of the present invention, extended to multiple-bit writing.

In addition, as shown in FIG. 46, in the data write current supply configuration according to the fifth embodiment shown in FIG. 36 as well, a plurality of sets of write data bus WDB and data write circuit 100 are provided, the number of sets being corresponding to the number of bits written in parallel, whereby multiple-bit parallel data write in a similar manner can be realized. In this case as well, switching elements S3, S4a, S4b, Sa, and Sb in the selected bit line corresponding to each write node should be operated in parallel in a similar sequence.

Figure 47:
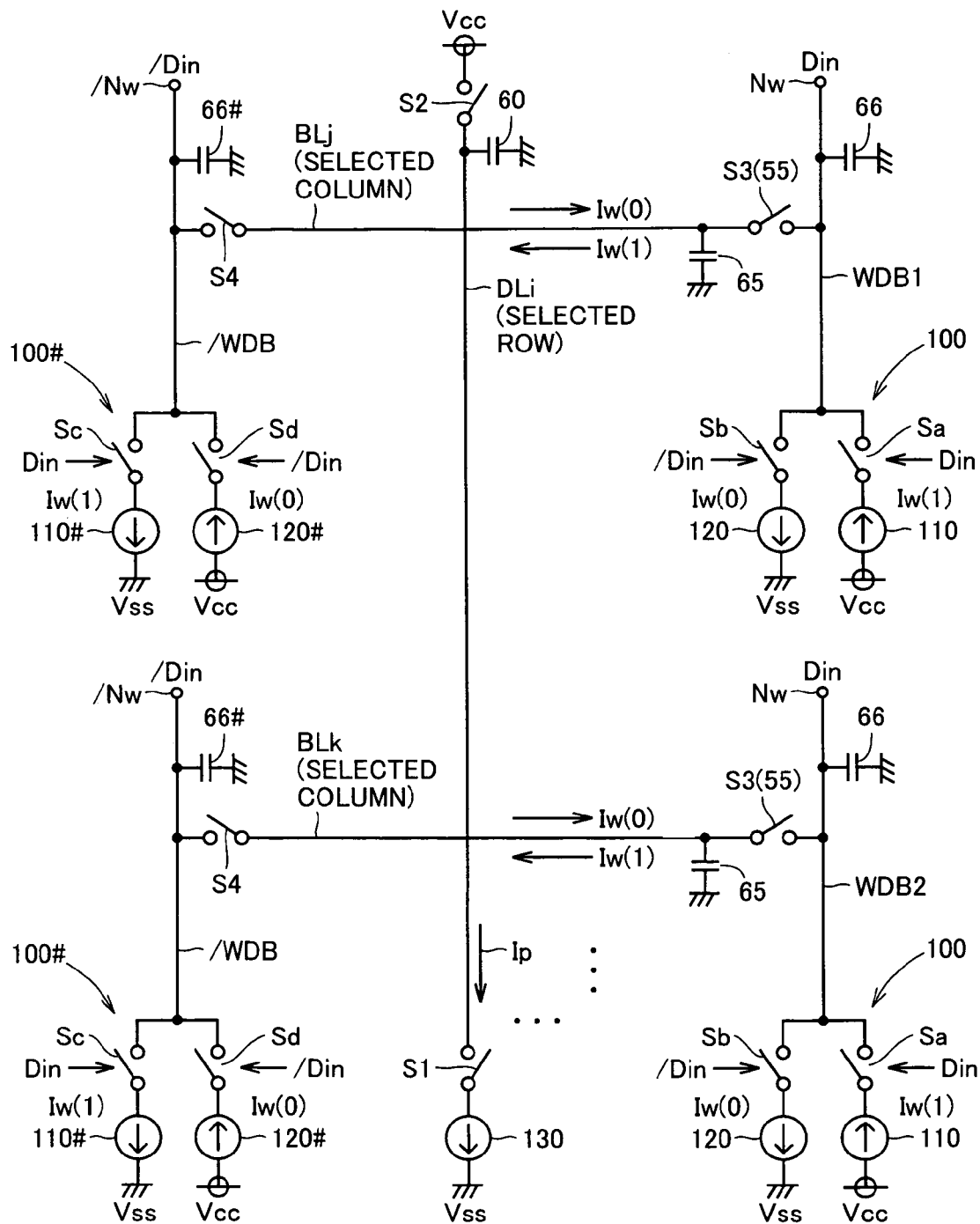
FIG. 47 is a conceptual view illustrating another data write current supply configuration according to the fifth embodiment of the present invention, extended to multiple-bit writing.

Moreover, as shown in FIG. 47, in the data write current supply configuration according to the fifth embodiment shown in FIG. 38 as well, a plurality of sets of write data bus WDB and data write circuit 100 and a plurality of sets of write data bus /WDB and data write circuit 100# are provided, the number of sets being corresponding to the number of bits written in parallel, whereby multiple-bit parallel data write in a similar manner can be realized. In this case as well, switching elements S3, S4, and Sa to Sd in the selected bit line corresponding to each write node should be operated in parallel in a similar sequence.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device comprising:
   a plurality of first write current lines for selectively feeding a first data write current;
   a plurality of magnetic memory cells into which data is written by application of magnetic field produced by said first data write current;
   a first switching element provided corresponding to one end of each of said first write current lines; wherein
   said first switching element is arranged to allow said first data write current to flow by connecting corresponding one of said first current write lines charged to a first voltage to a second voltage different from said first voltage;
   a second switching element provided corresponding to the other end of each of said first write current lines, wherein
   said second switching element is conducted during at least a part of a non-conducted period of said first switching element, so as to electrically connect said corresponding first write current line to said first voltage, and is rendered non-conducting during a conducted period of said first switching element, so as to electrically disconnect said corresponding first write current line from said first voltage.

2. The thin film magnetic memory device according to claim 1, further comprising a charge adjusting resistor arranged so as to be electrically connected between corresponding one of said first write current lines and said first voltage during a period in which said second switching element is conducted.

3. A thin film magnetic memory device comprising:
a plurality of first write current lines for selectively feeding a first data write current;
a plurality of magnetic memory cells into which data is written by application of magnetic field produced by said first data write current;
a first switching element provided corresponding to one end of each of said first write current lines; wherein
said first switching element is arranged to allow said first data write current to flow by connecting corresponding one of said first current write lines charged to a first voltage to a second voltage different from said first voltage;
a sub switching element provided corresponding to said one end of each of said first write current lines, wherein
said first switching element is arranged to allow said first data write current to flow in response to conduction of the first switching element itself, and is rendered non-conducting when corresponding one of said first write current lines is charged to said second voltage and said first data write current no longer flows, and
said sub switching element is connected after said first switching element is rendered non-conducting, and electrically connects said corresponding first write current line charged to said second voltage to said first voltage, so as to allow said first data write current to flow.

4. A thin film magnetic memory device comprising:
a plurality of first write current lines for selectively feeding a first data write current;
a plurality of magnetic memory cells into which data is written by application of magnetic field produced by said first data write current;
a first switching element provided corresponding to one end of each of said first write current lines; wherein
said first switching element is arranged to allow said first data write current to flow by connecting corresponding one of said first current write lines charged to a first voltage to a second voltage different from said first voltage; and
an additional capacitor connected to each of said first write current lines upstream from said plurality of magnetic memory cells on a path for charging each of said first write current lines to said first voltage.

5. The thin film magnetic memory device according to claim 4, wherein
said additional capacitor is provided corresponding to each of said plurality of first write current lines.

6. The thin film magnetic memory device according to claim 4, wherein
said additional capacitor is commonly connected to at least two of said plurality of first write current lines.

7. The thin film magnetic memory device according to claim 4, wherein said additional capacitor is configured to include a capacitive component of a hierarchically higher write line provided hierarchically with respect to said plurality of first write current lines.

8. A thin film magnetic memory device comprising:
a plurality of first write current lines for selectively feeding a first data write current;
a plurality of magnetic memory cells into which data is written by application of magnetic field produced by said first data write current;
a first switching element provided corresponding to one end of each of said first write current lines; wherein
said first switching element is arranged to allow said first data write current to flow by connecting corresponding one of said first current write lines charged to a first voltage to a second voltage different from said first voltage;
a plurality of second write current lines for selectively feeding a second data write current in a direction in accordance with write data,
a write node set to one of a plurality of data voltages in accordance with the write data,
a third switching element provided corresponding to one end of each of said second write current lines and for electrically connecting said one end to said write node, and
a plurality of fourth switching elements for electrically connecting the other ends of said second write current lines to said plurality of data voltages respectively, wherein
said first data write current flows in a prescribed direction on selected one of said first write current lines, regardless of said write data,
said write data is written in each of said magnetic memory cells depending on a combination of magnetic fields produced by said first data write current and said second data write current respectively,
said third switching element is rendered non-conducting after corresponding one of said second write current lines is charged to a voltage of said write node in response to conduction of the third switching element itself, and
said second data write current is allowed to flow when one of said plurality of fourth switching elements, corresponding to a data voltage different from the voltage of said write node, is conducted after said third switching element is rendered non-conducting.

9. The thin film magnetic memory device according to claim 8, wherein
a plurality of fourth switching elements are connected one by one in a prescribed order during a single data write operation, regardless of a level of said write data.

10. The thin film magnetic memory device according to claim 8, wherein
one of said plurality of fourth switching elements in accordance with a level of said write data is selectively conducted during a single data write operation.

11. The thin film magnetic memory device according to claim 8, further comprising a charge adjusting resistor arranged so as to be electrically connected between corresponding one of said second write current lines and said write node during a period in which said third switching element is conducted.

12. The thin film magnetic memory device according to claim 8, further comprising an additional capacitor connected to each of said second write current lines upstream from said plurality of magnetic memory cells on a path for charging each of said second write current lines to the voltage of said write node.

13. The thin film magnetic memory device according to claim 12, wherein
said additional capacitor is provided corresponding to each of said plurality of second write current lines.

14. The thin film magnetic memory device according to claim 12, wherein
said additional capacitor is configured to include a capacitive component of a hierarchically higher write line electrically connected between said write node and said plurality of second write current lines.

15. A thin film magnetic memory device comprising:
a plurality of first write current lines for selectively feeding a first data write current;
a plurality of magnetic memory cells into which data is written by application of magnetic field produced by said first data write current;
a first switching element provided corresponding to one end of each of said first write current lines; wherein
said first switching element is arranged to allow said first data write current to flow by connecting corresponding one of said first current write lines charged to a first voltage to a second voltage different from said first voltage;
a plurality of second write current lines for selectively feeding a second data write current in a direction in accordance with write data,
first and second write nodes charged to one and another one of a plurality of data voltages in accordance with a level of the write data, respectively,
a third switching element provided corresponding to one end of each of said second write current lines and for electrically connecting said one end to said first write node, and
a fourth switching element provided corresponding to the other end of each of said second write current lines and for electrically connecting said other end to said second write node, wherein
said first data write current flows in a prescribed direction on selected one of said first write current lines, regardless of said write data,
said write data is written in each of said magnetic memory cells depending on a combination of magnetic fields produced by said first data write current and said second data write current respectively, and
said third and fourth switching elements are rendered non-conducting during charging of said first and second write nodes, and conducted in order to allow said second data write current to flow after said first and second write nodes are charged.

16. The thin film magnetic memory device according to claim 15, further comprising charge adjusting resistors connected in series to paths for charging said first and second write nodes respectively.

17. A thin film magnetic memory device, comprising:
a plurality of write current lines for feeding a data write current flowing in a direction in accordance with write data;
a plurality of magnetic memory cells into which data is written by application of data write magnetic field produced by said data write current;
a data bus set to one of a plurality of data voltages in accordance with a level of said write data;
a first write switching element provided corresponding to one end of each of said write current lines and for electrically connecting said one end to said data bus; and
a plurality of second write switching elements for electrically connecting the other ends of said write current lines to said plurality of data voltages respectively; wherein
one of said plurality of second write switching elements, corresponding to a data voltage different from a voltage of said data bus, is conducted in order to allow said second data write current to flow.

18. A thin film magnetic memory device, comprising:
a plurality of write current lines for feeding a data write current flowing in a direction in accordance with write data;
a plurality of magnetic memory cells into which data is written by application of data write magnetic field produced by said data write current;
a first write driver shared by at least two write current lines of said plurality of write current lines; and
a second write driver arranged corresponding to each of said plurality of write current lines; wherein
said first write driver connects one end side of said at least two write current lines to one of a plurality of data voltages in accordance with a level of the write data when said at least two write current lines sharing the first write driver include a data write target, and
said second write driver connects the other end side of corresponding write current line to another one of said plurality of data voltages when the corresponding write current line is the data write target, while it disconnects the other end side of the corresponding write current line from any other one of said plurality of data voltages when the corresponding write current line is not the data write target.

* * * * *